(12) United States Patent
Ito

(10) Patent No.: US 7,868,797 B2
(45) Date of Patent: Jan. 11, 2011

(54) SAMPLE/HOLD CIRCUIT, AND ANALOG-TO-DIGITAL CONVERTER

(75) Inventor: Tomohiko Ito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 12/469,736

(22) Filed: May 21, 2009

(65) Prior Publication Data

US 2010/0066581 A1 Mar. 18, 2010

(30) Foreign Application Priority Data

May 23, 2008 (JP) ............................ 2008-135758

(51) Int. Cl.
*H03M 1/00* (2006.01)
(52) U.S. Cl. .................... 341/122; 341/155; 341/161; 341/172
(58) Field of Classification Search ......... 341/122–125, 341/143, 155, 161, 172
See application file for complete search history.

(56) References Cited

U.S. PATENT DOCUMENTS

| | | | | |
|---|---|---|---|---|
| 5,594,445 A * | 1/1997 | Ginetti | ...................... | 341/162 |
| 5,764,176 A * | 6/1998 | Ginetti | ...................... | 341/161 |
| 6,097,326 A * | 8/2000 | Opris et al. | ................. | 341/161 |
| 6,914,550 B2 * | 7/2005 | Cai | ............................ | 341/155 |
| 6,967,509 B2 * | 11/2005 | Rossi | ......................... | 327/124 |
| 7,034,737 B1 * | 4/2006 | Huang | ........................ | 341/172 |
| 7,088,273 B1 * | 8/2006 | Perdoor et al. | .............. | 341/120 |
| 7,088,278 B2 | 8/2006 | Kurose et al. | | |
| 7,236,118 B2 | 6/2007 | Kurose et al. | | |
| 7,250,895 B2 | 7/2007 | Kurose et al. | | |
| 7,385,536 B2 * | 6/2008 | Kinyua et al. | ............... | 341/122 |
| 7,436,344 B2 * | 10/2008 | Ogita et al. | ................. | 341/172 |
| 7,515,086 B2 * | 4/2009 | Ryu | .......................... | 341/161 |
| 7,579,885 B2 * | 8/2009 | Rossi | ......................... | 327/124 |
| 7,683,819 B2 * | 3/2010 | Kurauchi | .................... | 341/172 |
| 7,728,752 B2 * | 6/2010 | Ali et al. | .................... | 341/161 |

OTHER PUBLICATIONS

Kazutaka Honda, et al, "A 14b Low-power Pipeline A/D Converter Using a Pre-charging Technique," IEEE Symposium on VLSI Circuits Digest of Technical Papers, pp. 196-197, 2007.

* cited by examiner

*Primary Examiner*—Linh V Nguyen
(74) *Attorney, Agent, or Firm*—Turocy & Watson, LLP

(57) ABSTRACT

There is disclosed a sample-and-hold circuit. An operational amplifier includes an inverting input terminal, a non-inverting input terminal, an inverting output terminal, and a non-inverting output terminal. First and second groups of capacitors are operated in first to third modes periodically. Positive and negative input signals are input to charge an electric charge in the first mode, electric charge are held while positive and negative output signals are output from the operational amplifier by connecting between the inverting input terminal and the non-inverting output terminal and by connecting between the non-inverting input terminal and the inverting output terminal in the second mode, and electric charge are discharged in the third mode. Second group of capacitors shifts to the third mode when first group of capacitors is in the first or second mode, and shift to the first or second mode when first group of capacitors is in the third mode.

6 Claims, 28 Drawing Sheets

SAMPLE/HOLD CIRCUIT, AND ANALOG-TO-DIGITAL CONVERTER

CROSSREFERENCE TO RELATED APPLICATIONS

This application is based upon and claims the benefit of priority from the prior Japanese Patent Application No. 2008-135758, filed on May 23, 2008, the entire contents of which are incorporated herein by reference.

BACKGROUND OF THE INVENTION

1. Field of the Invention

The present invention relates to a sample-and-hold circuit and a pipeline analog-to-digital converter.

2. Description of the Related Art

A sample-and-hold (S/H) circuit is a circuit to sample and hold a input signal from a input stage. The S/H circuit includes a switch, a capacitor, and an operational amplifier. The S/H circuit samples and holds the input signal by switching. One terminal of the capacitor is connected to an input terminal of the operational amplifier, and the other terminal of the capacitor is connected to either the input stage which supplies the input signal or an output terminal of the operational amplifier through the switch.

The other terminal of the capacitor is connected to the input stage through the switch during sampling the input signal (hereinafter, referred to as "sample mode"). The capacitor is charged according to a voltage of the input signal from the input stage. On the other hand, the other terminal of the capacitor is connected to the output terminal of the operational amplifier holding the input signal (hereinafter, referred to as "hold mode"). During the hold mode, the capacitor keeps to hold the electric charge which is charged in the sample mode. The sample mode and the hold mode are switched alternately in the S/H circuit. It means that the S/H circuit samples and holds the input signal periodically.

A pipeline analog-to-digital converter (hereinafter, referred to as "pipeline A/D converter") includes the S/H circuit and cascaded convert stages. Each convert stage has a multiplying digital-to-analog converter (hereinafter, referred to as "MDAC"). The MDAC is also one of the S/H circuits. The MDAC has almost same circuit architecture as the S/H circuit, which includes a switch, a capacitor, and an operational amplifier. The MDAC samples and holds an analog input signal from a previous convert stage as same as the S/H circuit. In addition to the MDAC, each convert stage also has a comparator to convert the analog input signal to a digital input signal.

Both the S/H circuit in the pipeline A/D converter and the S/H circuit in each convert stage (MDAC) realize a sampling of the input signal by charging the capacitor. For example, the operational amplifier in the MDAC of a convert stage is used to charge the capacitor in the MDAC of the next convert stage. It is known that the consumption power of the operational amplifier is relatively large in the total consumption of the pipeline A/D converter.

Because the S/H circuit in the pipeline A/D converter and the S/H circuit in each convert stage (MDAC) sample and hold the input signal continuously, the electric charge which have been held during the hold mode may still remain in the capacitor when the sample mode starts. Therefore, in each sample mode, the capacitor may be charged or discharged an amount of electric charge according to a voltage of the input signal which has a range from minimum to maximum or from maximum to minimum.

One of the conventional pipeline A/D converters is disclosed by K. Honda et Al. "A 14b Low-power Pipelined A/D Converter Using a Pre-charging Technique", Dig. Symp. VLSI Circuits, pp. 196-197, June 2007. In this reference, a pipeline A/D converter does not sample and hold an input signal continuously, and discharge the electric charge which has been held in the capacitors before sampling the input signal. Since the pipeline A/D converter discharge the electric charge to half amount of the maximum capacitance of each capacitor once, it may not need to charge from 0 volt to maximum voltage or discharge from maximum voltage to 0 volt in the next sample mode. This means the pipeline A/D converter may charge or discharge only half amount of the maximum capacitance of each capacitor. Therefore, the pipeline A/D converter can decrease amount of the electric charge which is required to charge to each capacitor at once in the sample mode.

However, the pipeline A/D converter in the reference needs a time to discharge the electric charge from the capacitors in addition to the time to be required for sampling and holding the input signal. Therefore, the time for sampling and holding is shortened to keep the time for discharging the electric charge. As a result, the capacitors have to discharge the electric charge in a short time before sampling the input signal.

SUMMARY OF THE INVENTION

According to one aspect of the invention, a sample-and-hold circuit comprises:

an operational amplifier including an inverting input terminal, a non-inverting input terminal, an inverting output terminal, and a non-inverting output terminal; and a first and second groups of capacitors each being operated in first to third modes periodically, wherein positive and negative input signals being input to charge an electric charge in the first mode, the electric charge being held while positive and negative output signals being output from the operational amplifier by connecting between the inverting input terminal and the non-inverting output terminal and by connecting between the non-inverting input terminal and the inverting output terminal in the second mode, and the electric charge being discharged in the third mode;

wherein the second group of capacitors shifts to the third mode when the first group of capacitors is in the first or second mode, and shift to the first or second mode when the first group of capacitors is in the third mode.

DETAILED DESCRIPTION OF THE INVENTION

The embodiments of the invention will be explained with reference to the accompanying drawings.

Description of the First Embodiment

Figure 1:
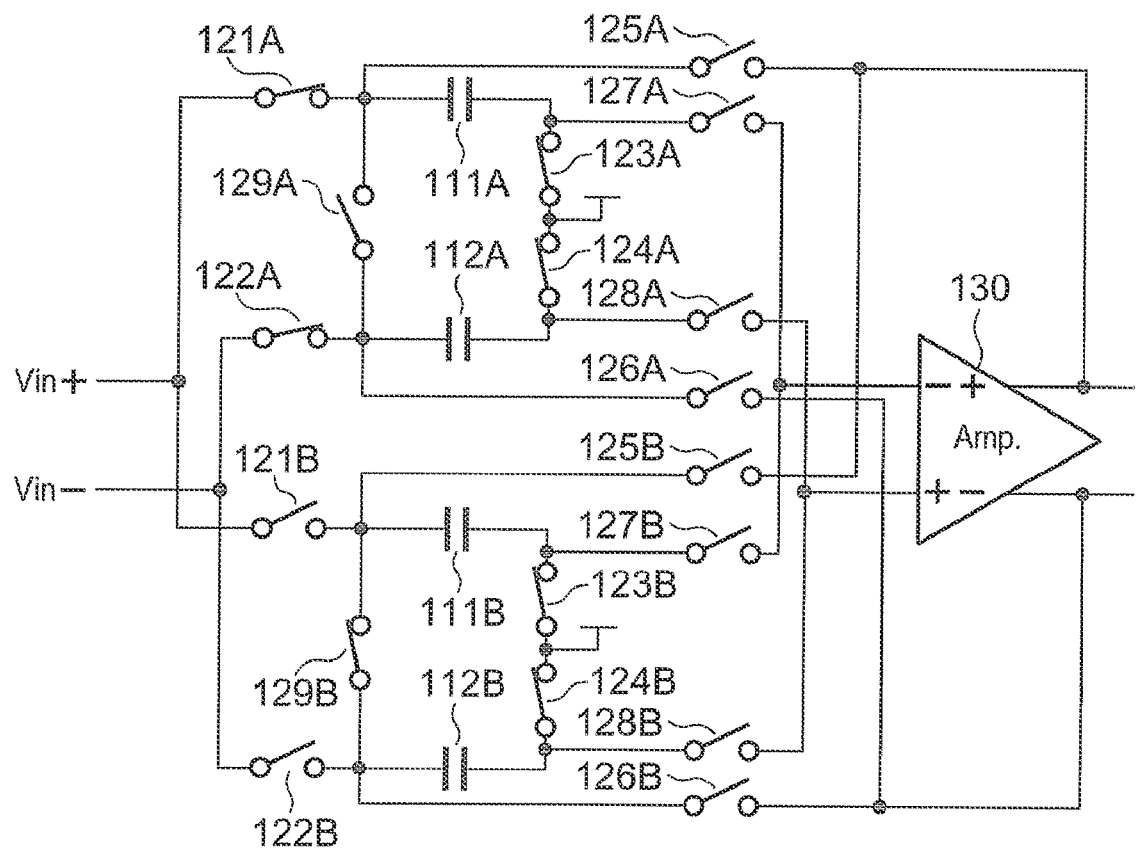
FIG. 1 is a block diagram showing a S/H circuit in the first phase according to the first embodiment.

The first embodiment will explain a S/H circuit (MDAC) in each convert stage. As shown in FIG. 1, a S/H circuit in each convert stage includes capacitors 111A, 112A (hereinafter, referred to as "first capacitor set"), switches 121A-129A, other capacitors 111B, 112B (hereinafter, referred to as "second capacitor set"), other switches 121B-129B, and an operational amplifier 130. Each of capacitors 111A, 112A, 111B, and 112B has a same capacitance.

The S/H circuit realizes several behaviors (such as, a sample mode and a hold mode) by switching due to the switches 121A-129A and 121B-129B. These behaviors are classified in four phases based on connection status of switches as shown in FIGS. 1-4, respectively.

Figure 2:
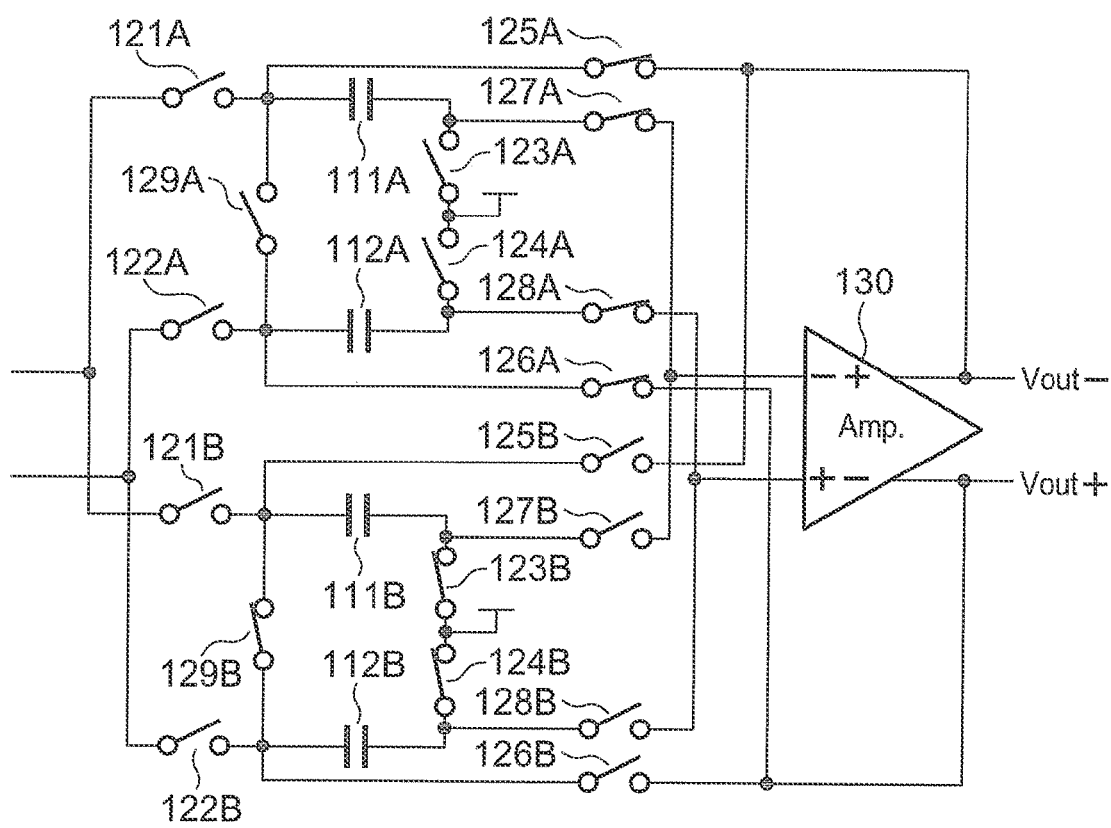
FIG. 2 is a block diagram showing the S/H circuit in the second phase.
Figure 3:
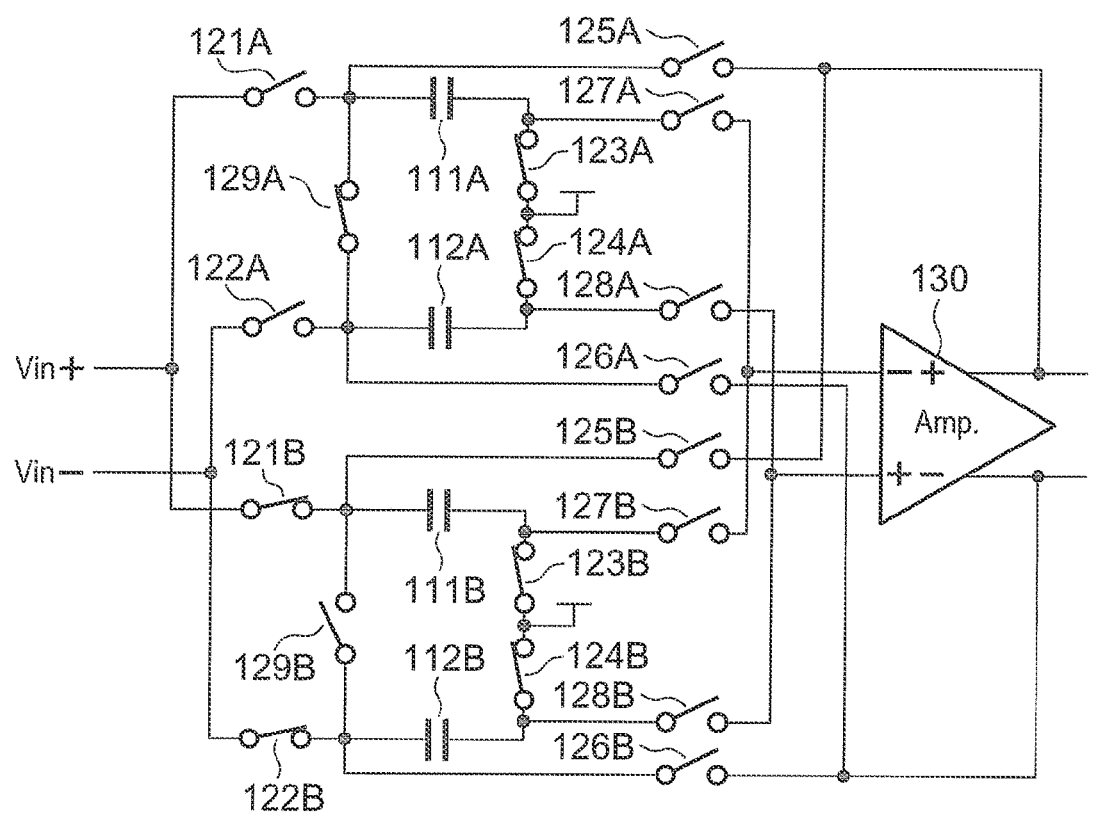
FIG. 3 is a block diagram showing the S/H circuit in the third phase.
Figure 4:
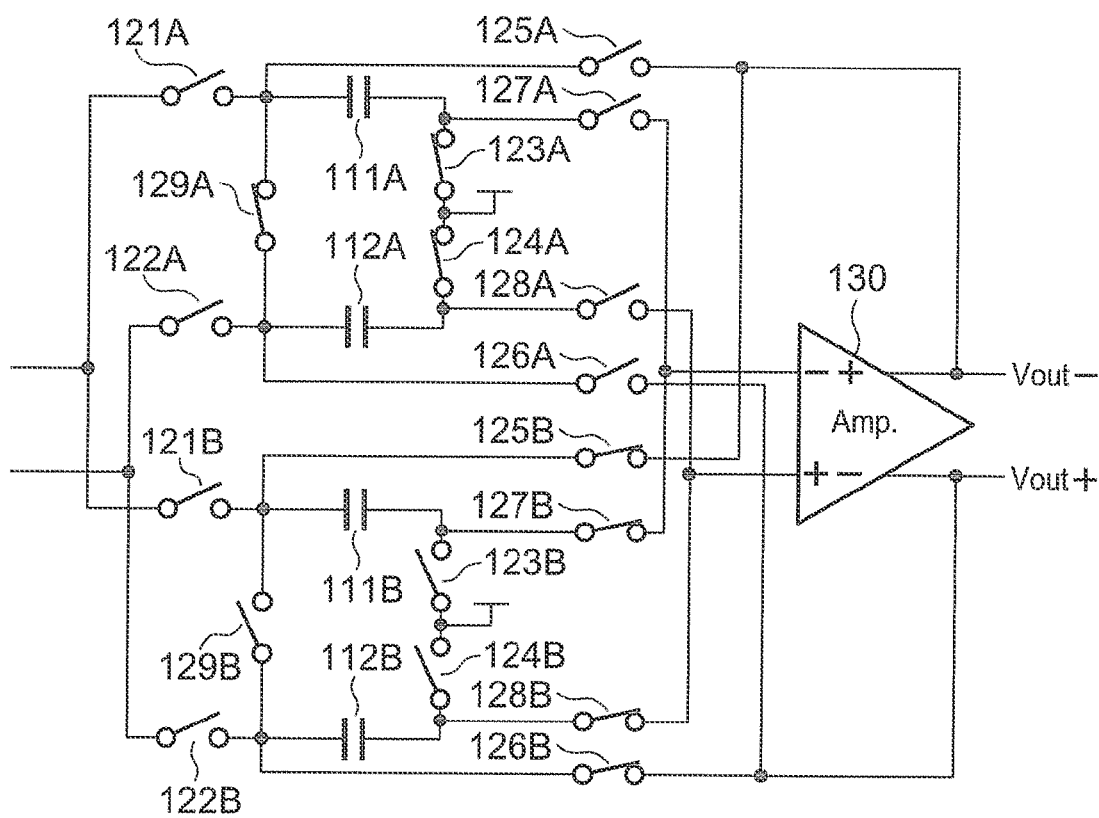
FIG. 4 is a block diagram showing the S/H circuit in the fourth phase.

The first phase shown in FIG. 1 is the sample mode using the first capacitor set. The second phase shown in FIG. 2 is the hold mode using the first capacitor set. The third phase shown in FIG. 3 is the sample mode using the second capacitor set. The forth phase shown in FIG. 4 is the hold mode using the second capacitor set. The S/H circuit in the first embodiment performs the first to fourth phases periodically to sample and hold the input signals Vin+, Vin−.

The S/H circuit samples input signals Vin+ and Vin− from a input stage (not shown) in the first and third phases. Also, the S/H circuit holds these sampled input signals Vin+, Vin−, and outputs output signals Vout+, Vout− in the second and fourth phase. The signals Vin+, Vin−, Vout+, and Vout− are all analog. Moreover, the minimum voltage of these signals is Vrefm (Vreference-minus), and the maximum voltage is Vrefp (Vreference-plus). The common-mode voltage of the input signals Vin+, Vin− is Vcom (Vcommon-mode=(Vin++Vin−)/2).

One terminal of the capacitor 111A is connected to a terminal of the capacitor 112A through the switches 123A, 124A in the first, third and fourth phases, and connected to an inverting input terminal of the operational amplifier 130 through the switch 127A in the second phase.

The other terminal of the capacitor 111A is input the input signal Vin+ through the switch 121A in the first phase, and connected to a non-inverting output terminal of the operational amplifier 130 through the switch 125A in the second phase. Also, the other terminal of the capacitor 111A is connected to the other terminal of the capacitor 112A through the switch 129A in the third and fourth phases.

One terminal of the capacitor 112A is connected to a terminal of the capacitor 111A through the switches 124A, 123A in the first, third and fourth phases, and connected to a non-inverting input terminal of the operational amplifier 130 through the switch 128A in the second phase.

The other terminal of the capacitor 112A is input the input signal Vin− through the switch 122A in the first phase, and connected to a inverting output terminal of the operational amplifier 130 through the switch 126A in the second phase. Also, the other terminal of the capacitor 112A is connected to the other terminal of the capacitor 111A through the switch 129A in the third and fourth phases.

One terminal of the capacitor 111B is connected to a terminal of the capacitor 112B through the switches 123B, 124B in the first, second and third phases, and connected to an inverting input terminal of the operational amplifier 130 through the switch 127B in the fourth phase.

The other terminal of the capacitor 111B is input the input signal Vin+ through the switch 121B in the third phase, and connected to a non-inverting output terminal of the operational amplifier 130 through the switch 125B in the fourth phase. Also, the other terminal of the capacitor 111B is connected to the other terminal of the capacitor 112B through the switch 129B in the first and second phases.

One terminal of the capacitor 112B is connected to a terminal of the capacitor 111B through the switches 124B, 123B in the first, second and third phases, and connected to a non-inverting input terminal of the operational amplifier 130 through the switch 128B in the fourth phase. The other terminal of the capacitor 112B is input the input signal Vin− through the switch 122B in the third phase, and connected to an inverting output terminal of the operational amplifier 130 through the switch 126B in the fourth phase. Also, the other terminal of the capacitor 112B is connected to the other terminal of the capacitor 111B through the switch 129B in the first and second phases.

The operational amplifier 130 is a fully differential operational amplifier, including an inverting input terminal, a non-inverting input terminal, an inverting output terminal, and a non-inverting output terminal. The inverting input terminal and the non-inverting output terminal of the operational amplifier 130 are connected each other through the switch 127A, the capacitor 111A, and the switch 125A in the second phase. Also, they are connected each other through the switch 127B, the capacitor 111B, and the switch 125B in the fourth phase. On the other hand, the inverting input terminal and the non-inverting output terminal of the operational amplifier 130 are unconnected by turning off the switches 127A, 125A, 127B, 125B in the first and third phases. The non-inverting input terminal and the inverting output terminal of the operational amplifier 130 are connected each other through the switch 128A, the capacitor 112A, and the switch 126A in the second phase. Also, they are connected each other through the switch 128B, the capacitor 112B, and the switch 126B in the fourth phase. On the other hand, the non-inverting input terminal and the inverting output terminal of the operational amplifier 130 are unconnected by turning off the switches 128A, 126A, 128B, 126B in the first and third phases.

The behaviors of the S/H circuit in the first embodiment will be explained according to each phase. As shown in FIG. 1, the S/H circuit in the first phase is operating in the sample mode. The capacitors 111A, 112A sample the input signals Vin+, Vin− by turning on the switches 121A-124A and turning off the switches 125A-129A.

On the other hand, the capacitors 111B, 112B do not sample the input signals Vin+, Vin−. Both terminals of each of capacitors 111B, 112B are connected by turning on the switches 123B, 124B, 129B and turning off the switches 121B, 122B, 125B-128B. As a result, the voltages at both terminals of each of capacitors 111B, 112B become equal. Because the capacitances of the capacitors 111B, 112B are equal, electric charge in the capacitors 111B, 112B are discharged to be an average voltage at all terminals of capacitors 111B, 112B. The effect of this discharge will be described later.

As shown in FIG. 2, the S/H circuit in the second phase is operating in the hold mode. The capacitors 111A, 112A hold the input signals Vin+, Vin− which are sampled in the first phase by turning off the switches 121A-124A, 129A. Moreover, these held input signals Vin+, Vin− are output as output signals Vout+, Vout− by turning on the switches 125A-128A. Other switches 121B-128B operate as same as the first phase.

As shown in FIG. 3, the S/H circuit in the third phase is operating in the sample mode. The capacitors 111B, 112B sample the input signals Vin+, Vin− by turning on the switches 121B-124B and turning off the switches 125B-129B.

On the other hand, the capacitors 111A, 112A do not sample the input signals Vin+, Vin−. Both terminals of each of capacitors 111A, 112A are connected by turning on the switches 123A, 124A, 129A and turning off the switches 121A, 122A, 125A-128A. As a result, electric charge in the capacitors 111A, 112A are discharged to be an average voltage at all terminals of capacitors 111A, 112A. For example, the capacitor 111A holds more or less electric charge than the capacitor 112A in the second phase, the voltage at all terminals of capacitors 111A, 112A become equal to the common-mode voltage Vcom of the input signals Vin+ and Vin−.

As shown in FIG. 4, the S/H circuit in the fourth phase is operating in the hold mode. The capacitors 111B, 112B hold the input signals Vin+, Vin− which are sampled in the third phase by turning off the switches 121B-124B, 129B. Moreover, these held input signals Vin+, Vin− are output as output signals Vout+, Vout− by turning on the switches 125B-128B. Other switches 121A-128A operate as same as the third phase.

The S/H circuit in the first embodiment performs the first to fourth phases periodically to sample and hold the input signals Vin+, Vin−. As mentioned above, the capacitors 111B, 112B in the first and second phases and the capacitors 111A, 112A in the third and fourth phases do not sample and hold the input signals Vin+, Vin−. This means that the first capacitor set (including capacitors 111A, 112A) and the second capacitor set (including capacitors 111B, 112B) are alternately used to sample and hold the input signals Vin+, Vin− in the S/H circuit.

Next, we will describe the effect of the using two sets of the capacitors, and performing sampling, holding, and discharging, periodically.

Figure 5:
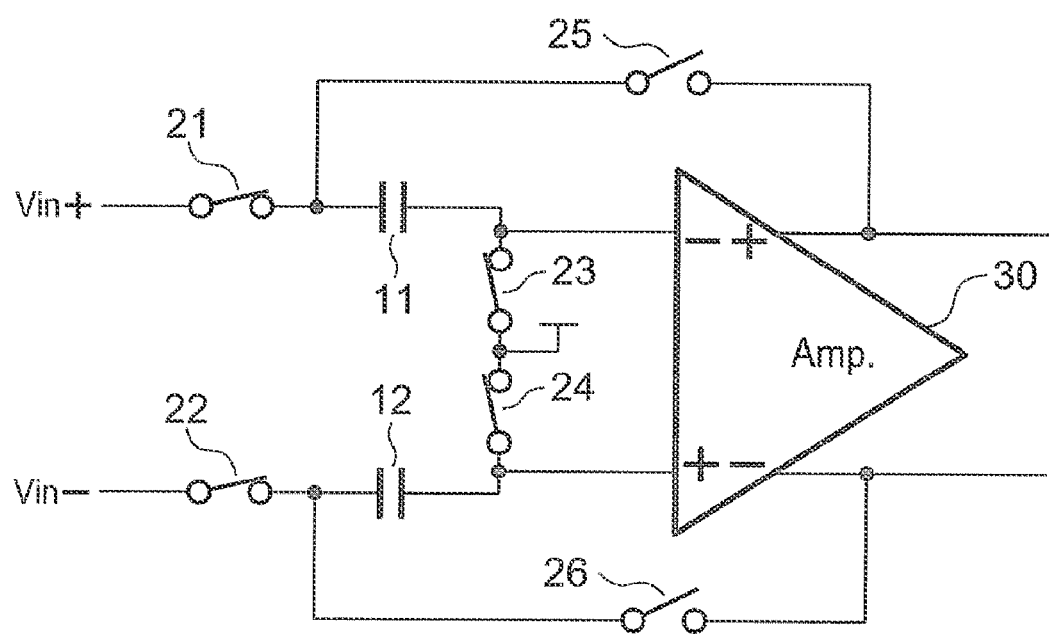
FIG. 5 is a figure explaining a technical point of the S/H circuit shown in FIGS. 1-4.
Figure 6:
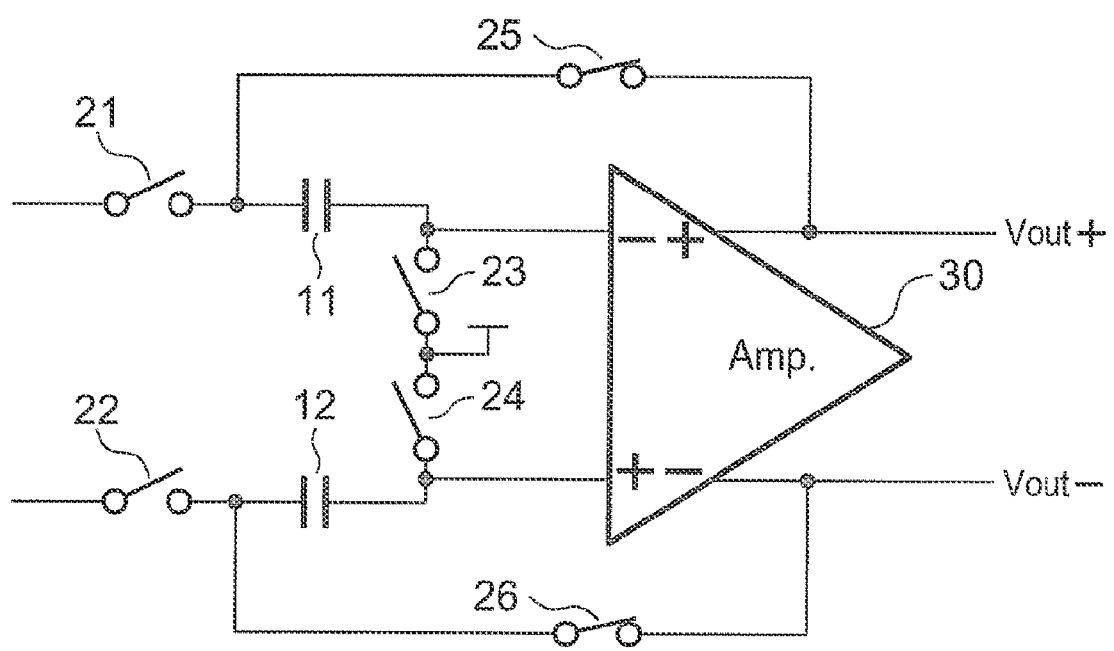
FIG. 6 is another figure explaining a technical point of the S/H circuit shown in FIGS. 1-4.

As shown in FIG. 5 and FIG. 6, a conventional S/H circuit has one set of capacitors including capacitors 11, 12. The conventional S/H circuit samples and holds input signals Vin+, Vin− using the set of capacitors continuously. As shown in FIG. 5, in the sample mode, one terminal of the capacitor 11 is connected to one terminal of capacitor 12 through the switches 23, 24. The other terminal of the capacitor 11 is input the input signal Vin+ through the switch 21, and the other terminal of the capacitor 12 is input the input signal Vin− through the switch 22. The capacitors 11, 12 have a same capacitance.

As shown in FIG. 6, in the hold mode, the other terminal of the capacitor 11 is unconnected with the input signal Vin+ by turning off the switch 21, and the other terminal of the capacitor 12 is also unconnected with the input signal Vin− by turning off the switch 22. The inverting input terminal of the operational amplifier 30 is connected to the non-inverting output terminal through the capacitor 11 and the switch 25. Also, the non-inverting input terminal of the operational amplifier 30 is connected to the inverting output terminal through the capacitor 12 and the switch 26. The output signal Vout+ is output from the inverting input terminal of the operational amplifier 30, which is almost same as the input signal Vin+ sampled by the capacitor 11 in the sample mode. The output signal Vout− is output from the non-inverting input terminal of the operational amplifier 30, which is almost same as the input signal Vin− sampled by the capacitor 12 in the sample mode.

Because the conventional S/H circuit has only one set of the capacitors, the electric charge which have been held during the hold mode may still remain in the capacitors 11, 12 when the next sample mode starts. An example case, that the input signal Vin+ is Vrefp and Vin− is Vrefm in the sample mode (Vrefm<Vrefp), will be considered. The capacitor 11 is charged electric charge from the input stage to be Vcom at a terminal and Vrefp at the other terminal. The capacitor 12 is also charged electric charge from the input stage to be Vcom at a terminal and Vrefm at the other terminal. The electric charge in the capacitors 11, 12 are held during the next hold mode.

In the next sample mode, for example, the input signal Vin+ is Vrefm, and Vin− is Vrefp. The capacitor 11 is charged electric charge from the input stage to be Vcom at a terminal and Vrefm at the other terminal. The capacitor 12 is also charged electric charge from the input stage to be Vcom at a terminal and Vrefp at the other terminal. Because the electric charge in the capacitors 11, 12 are held during the previous hold mode, the capacitor 11 needs to discharge to be Vrefm from Vrefp at the other terminal. Also, the capacitor 12 needs to charge to be Vrefp from Vrefm at the other terminal.

On the other hand, the S/H circuit in the first embodiment discharges the capacitors once before the sample mode. For example, the capacitors 111A, 112A in the third and forth phases discharge electric charge which have been held during the second phase by connecting between both terminals of the capacitors 111A and 112A. Then, the next first phase will start. Moreover, the capacitors 111B, 112B in the first and second phases discharge electric charge switch have been held during the fourth phase by connecting between both terminals of the capacitors 111B and 112B. Then, the next third phase will start. The voltages at all terminals of capacitors 111A, 112A, 111B, 112B become Vcom before the sample mode, that is first and third phases, starts.

Therefore, the amount of electric charge which is required to charge the capacitors 111A, 112A, 111B, 112B are almost half compared with the conventional S/H circuit. For example, when the capacitors 11, 12, 111A, 112A, 111B, 112B have all same capacitance "C", the amount of electric charge for charging the capacitors 11, 12 in the conventional S/H circuit could be "C|Vrefp−Vrefm|". On the other hand, the amount of electric charge for charging the capacitors 111A, 112A, 111B, 112B in the S/H circuit of the first embodiment could be "C|Vrefp−Vcom|". Since the common-mode voltage. Vcom equals to an average of Vrefp and Vrefm, the amount of electric charge for charging may be "C|Vrefp−Vrefm|/2" in the S/H circuit of the first embodiment.

As described above, the S/H circuit in the first embodiment has two sets of capacitors. One set of capacitors discharges while the other set of capacitors are performing sampling and holding. Therefore, the S/H circuit in the first embodiment decreases the amount of electric charge to be used for charge compared with the conventional S/H circuit. As a result, the S/H circuit in the first embodiment decreases the consumption power.

Description of the Second Embodiment

Figure 7:
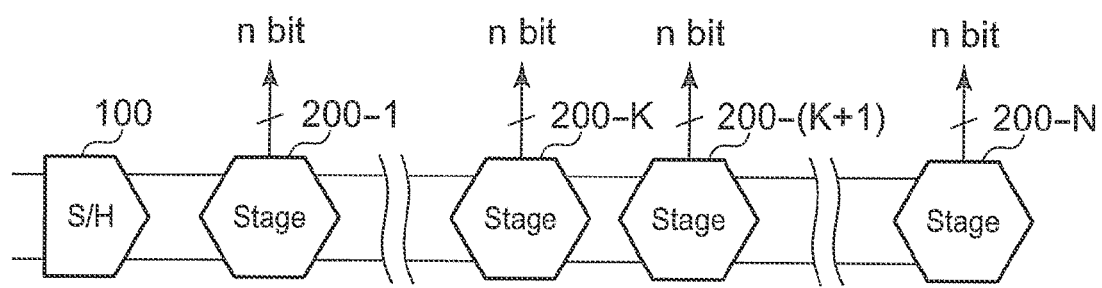
FIG. 7 is a block diagram showing an A/D converter according to the second embodiment.

The second embodiment will explain an A/D converter using a S/H circuit (MDAC) of the first embodiment. As shown in FIG. 7, an A/D converter in the second embodiment is a pipeline A/D converter. The pipeline A/D converter includes a S/H circuit 100 and cascaded N convert stages 200-1, . . . , 200-K, . . . , 200-N The S/H circuit 100 may be same as the S/H circuit in the first embodiment. An analog input signal is sampled by the S/H circuit 100. Then, the S/H circuit 100 inputs the sampled analog input signal into the first convert stage 200-1. The first convert stage 200-1 compares the voltage of the analog input signal with threshold voltages, and converts the analog input signal to a digital output signal obtained according to a result of the comparison between the voltage of the analog input signal and the threshold voltages. The digital output signal may have n bit-wide 1) including redundancy bits. For example, n=2 in the second embodiment. Since these digital bits includes 1 bit for redundancy every 2 convert stages in the second embodiment, the digital output signal has 1.5 bit-wide information for each convert stage. Generally, it is expressed as 1.5 bit/stage. In the case of 1.5 bit/stage, value of the digital output signal is any one of "00"/"01"/"11". To judge a value of digital output signal by comparing the voltage of the analog input signal with threshold voltages, two threshold voltages are used in the second embodiment. Moreover, the first convert stage 200-1 outputs an analog residual signal to the second convert stage 200-2. The analog residual signal is also obtained according to the result of the comparison between the voltage of the analog input signal and the threshold voltages. The second convert stage 200-2 converts the analog residual signal from the first convert stage 200-1 to a digital output signal, and inputs an analog residual signal into the third convert stage 200-3. Other convert stages 200-3, . . . , 200-N work as same as the first and second convert stages 200-1, 200-2. At last, these digital output signals from 200-1, . . . , 200-N are combined to obtain a digital signal with Mbit-wide (N≦M≦n×N) without redundancy bits, which means that the pipeline A/D converter has finished an analog to digital conversion.

Figure 8:
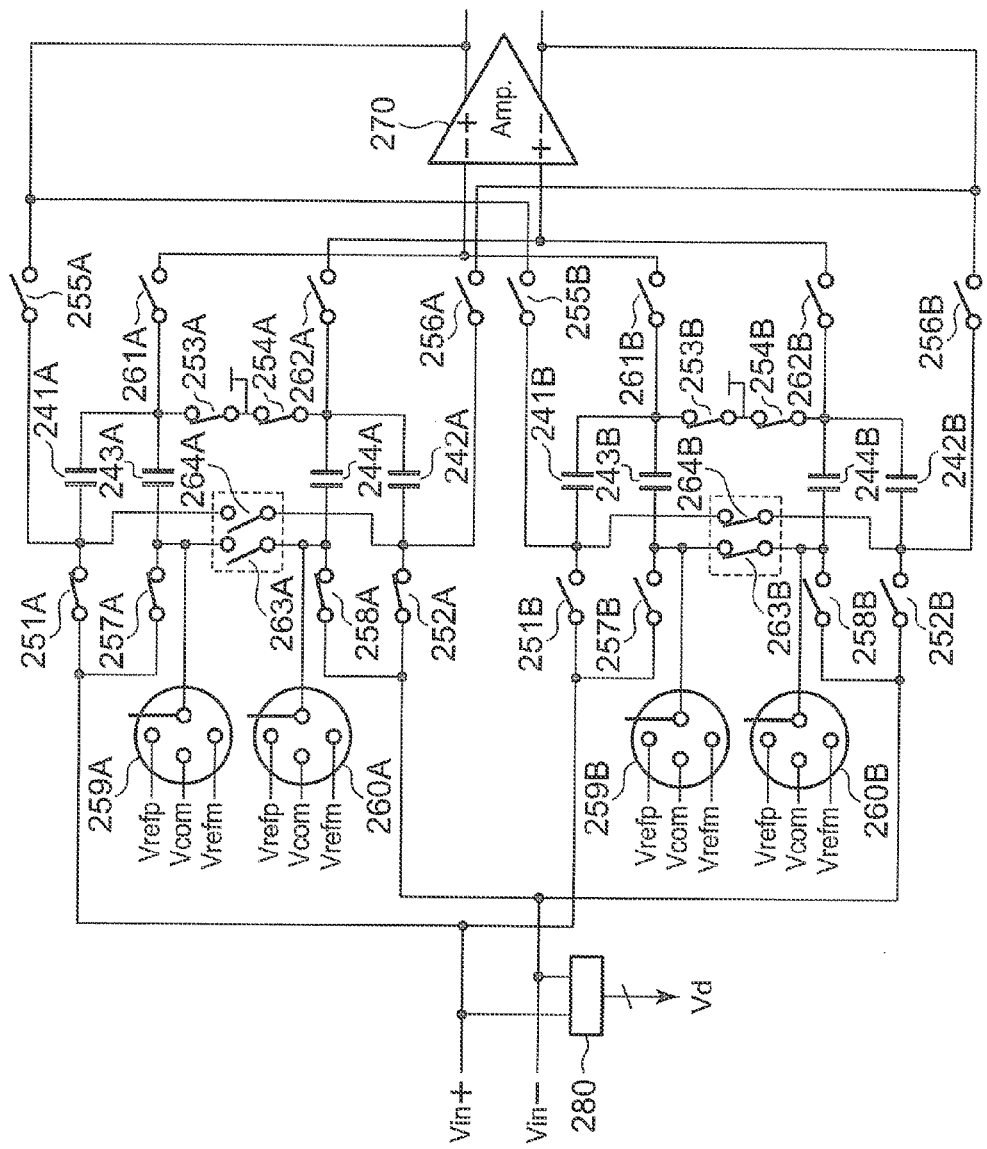
FIG. 8 is a block diagram showing a convert stage of the A/D converter in the first phase.

Next, we will explain the Kth convert stage 200-K, which is one of the convert stages 200-1, . . . , 200-N in the A/D converter. As shown in FIG. 8, the convert stage 200-K includes capacitors 241A-244A (hereinafter, referred to as "first capacitor set"), other capacitors 241B-244B (hereinafter, referred to as "second capacitor set"), switches 251A-264A, other switches 251B-264B, an operational amplifier 270, and a comparator 280. Each of capacitors 241A-244A and 241B-244B has a same capacitance. The capacitors 241A-244A, 241B-244B, the switches 251A-264A, 251B-254B, and the operational amplifier 270 provide for a S/H circuit (MDAC). In FIGS. 8-11, input signals Vin+, Vin− are the analog residual signal from the previous convert stage 200-(K−1), and output signals Vout+, Vout− are the analog residual signal to the next convert stage 200-(K+1). Vd from the comparator 280 is a digital output signal. The threshold voltages (not shown) are set in the comparator 280. Moreover, actually, the comparator 280 is connected (not shown in FIGS. 8-11) to the switches 259A, 260A, 259B and 260B to indicate value of the digital output signal Vd.

Figure 9:
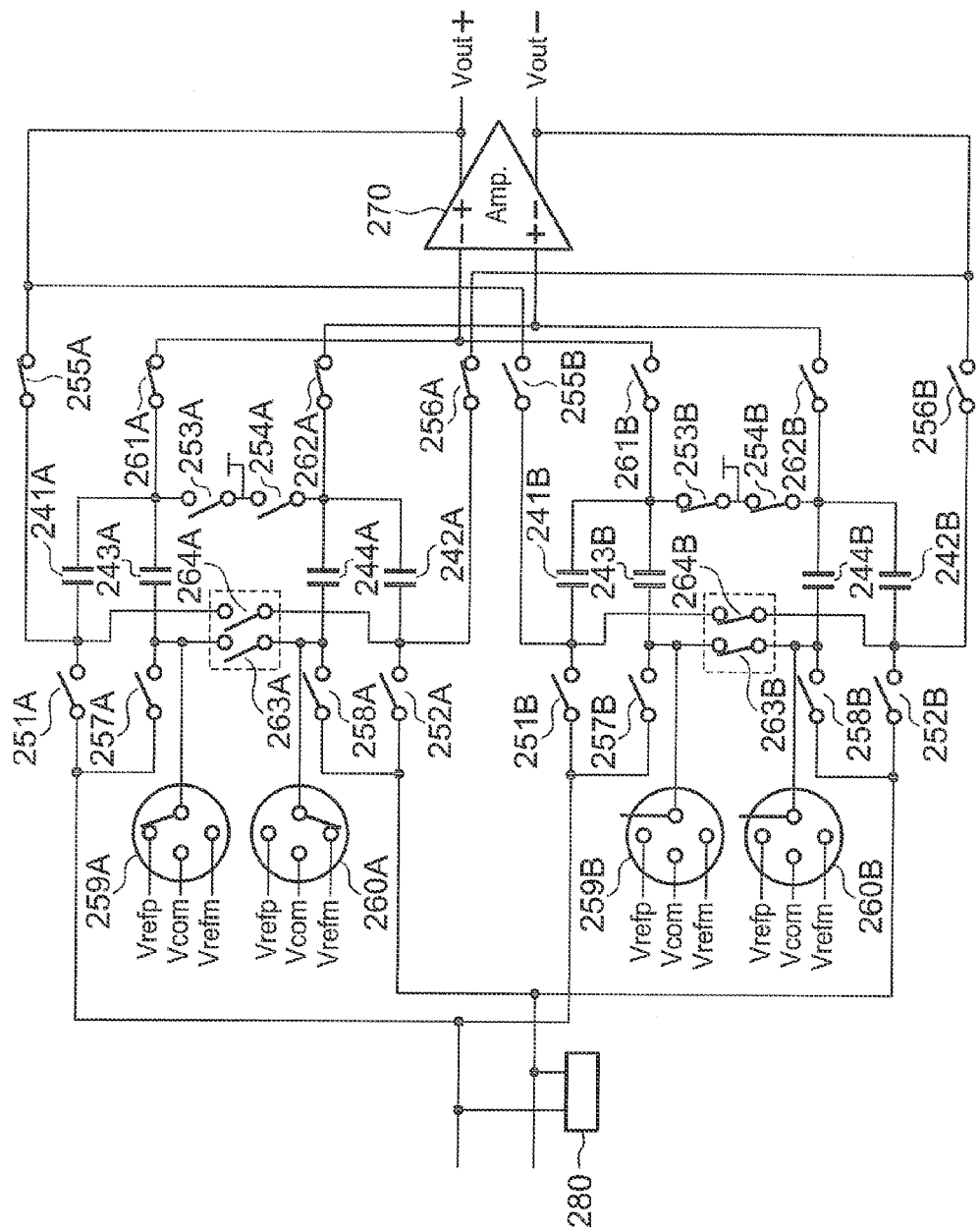
FIG. 9 is a block diagram showing the convert stage of the A/D converter in the second phase.
Figure 10:
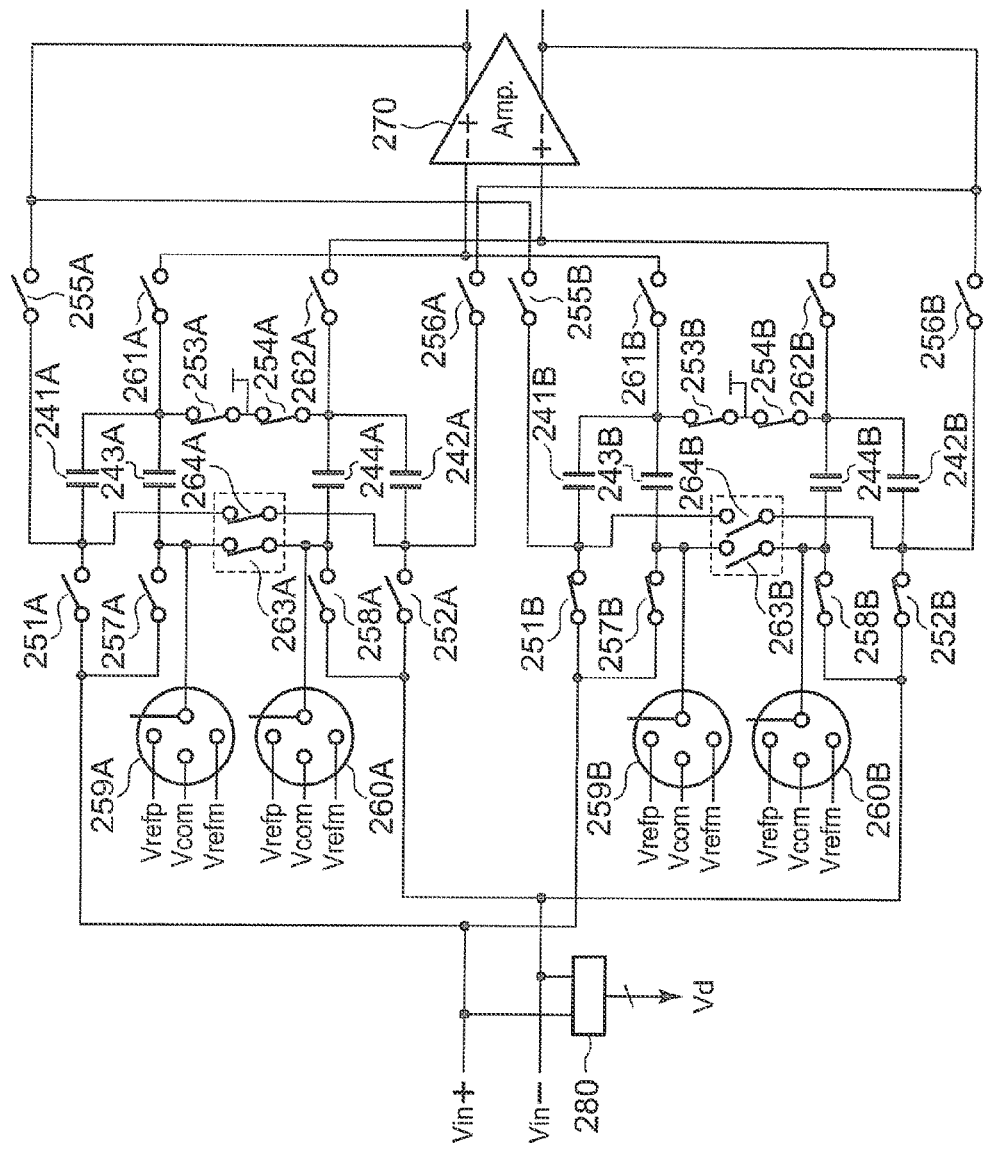
FIG. 10 is a block diagram showing the convert stage of the A/D converter in the third phase.
Figure 11:
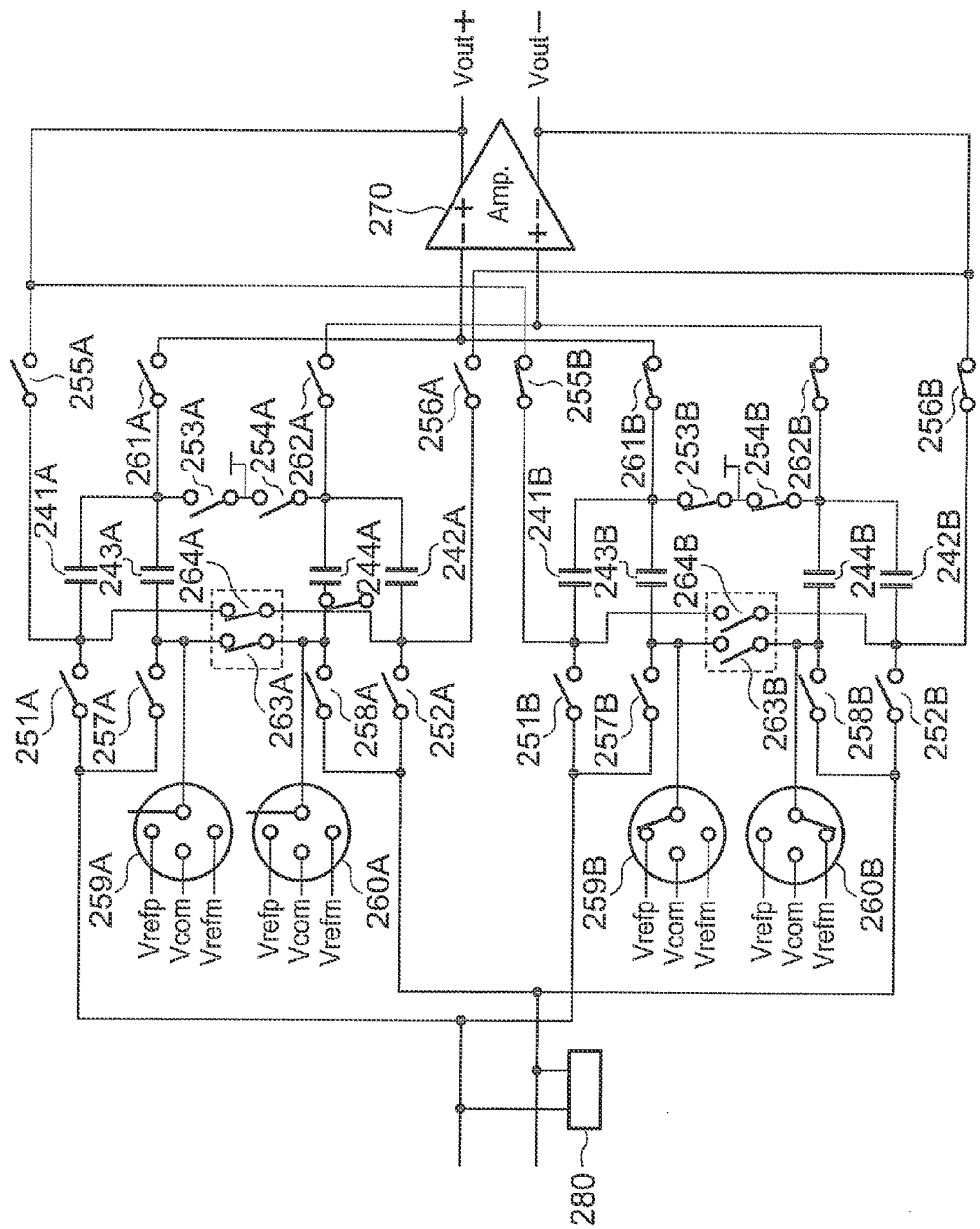
FIG. 11 is a block diagram showing the convert stage of the A/D converter in the fourth phase.

The convert stage 200-K realizes several behaviors (such as, a sample mode and a hold mode) by switching due to the switches 251A-264A and 251B-264B. These behaviors are classified in four phases based on connection status of switches as shown in FIGS. 8-11, respectively. The first phase shown in FIG. 8 is the sample mode using the first capacitor set. The second phase shown in FIG. 9 is the hold mode using the first capacitor set. The third phase shown in FIG. 10 is the sample mode using the second capacitor set. The forth phase shown in FIG. 11 is the hold mode using the second capacitor set. The convert stage in the second embodiment performs the first to fourth phases periodically to sample and hold the input signals Vin+, Vin−.

The convert stage 200-K samples the input signals Vin+, Vin− in the first and third phases. Moreover, the convert stage 200-K converts input signals Vin+, Vin− from the previous convert stage 200-(K−1) to a digital output signal Vd by comparing with the threshold voltages in the comparator 280 in the first and third phases.

On the other hand, the convert stage 200-K holds the input signals Vin+, Vin−, which are sampled in the first and third phases, in the second and forth phases. Also, the convert stage 200-K outputs the output signals Vout+, Vout− into the next convert stage 200-(K+1) in the second and forth phases. These output signals Vout+, Vout− are analog residual signals between the input signals Vin+, Vin− and the reference voltages from the switches 259A, 260A, 259B, and 260B. The reference voltages are determined according to the value of the digital output signal Vd from the comparator 280. Adjacent convert stages are in different phases at a given time. For example, when the convert stage 200-K is in the first or third phase, the previous convert stage 200-(K−1) and the next convert stage 200-(K+1) are in the second or fourth phase. Then, when the convert stage 200-K is in the second or fourth phase, the previous convert stage 200-(K−1) and the next convert stage 200-(K+1) are in the first or third phase.

The signals Vin+, Vin−, Vout+, and Vout− are all analog. Moreover, the minimum voltage of these signals is Vrefm (Vreference-minus), and the maximum voltage is Vrefp (Vreference-plus). The common-mode voltage of the input signals Vin+, Vin− is Vcom (Vcommon-mode=(Vin++Vin−)/2).

One terminal of the capacitor 241A is connected to a terminal of the capacitor 243A. Similarly, one terminal of the capacitors 242A is connected to a terminal of the capacitor 244A. The connection point of the capacitors 241A and 243A is connected to the connection point of the capacitors 242A and 244A through the switches 253A, 254A in the first, third and fourth phases. Also, the connection point of the capacitors 241A and 243A is connected to an inverting input terminal of the operational amplifier 270 through the switch 261A in the second phase. The other terminal of the capacitor 241A is input the input signal Vin+ through the switch 251A in the first phase, and connected to a non-inverting output terminal of the operational amplifier 270 through the switch 255A in the second phase. Also, the other terminal of the capacitor 241A is connected to the other terminal of the capacitor 242A through the switch 264A in the third and fourth phases. The other terminal of the capacitor 243A is input the input signal Vin+ through the switch 257A in the first phase, and input a reference voltage through the switch 259A in the second phase. One of the voltages Vrefp, Vcom, Vrefm is selected as the reference voltage in the switch 259A according to the value of digital output signal Vd. Since the digital output signal Vd could be three different values "00"/"01"/"11", the reference voltage has three choices Vrefp, Vcom, Vrefm. Also, the other terminal of the capacitor 243A is connected to the other terminal of the capacitor 244A through the switch 263A in the third and fourth phases.

The connection point of the capacitors 242A and 244A is connected to the connection point of the capacitors 241A and 243A through the switches 254A, 253A in the first, third and fourth phases. Also, the connection point of the capacitors 242A and 244A is connected to a non-inverting input terminal of the operational amplifier 270 through the switch 262A in the second phase. The other terminal of the capacitor 242A is input the input signal Vin− through the switch 252A in the first phase, and connected to a inverting output terminal of the operational amplifier 270 through the switch 256A in the second phase. Also, the other terminal of the capacitor 242A is connected to the other terminal of the capacitor 241A through the switch 264A in the third and fourth phases.

The other terminal of the capacitor 244A is input the input signal Vin− through the switch 258A in the first phase, and input the reference voltage through the switch 260A in the second phase. Also, the other terminal of the capacitor 244A is connected to the other terminal of the capacitor 243A through the switch 263A in the third and fourth phases.

One terminal of the capacitor 241B is connected to a terminal of the capacitor 243B. Similarly, one terminal of the capacitors 242B is connected to a terminal of the capacitor 244B. The connection point of the capacitors 241B and 243B is connected to the connection point of the capacitors 242B and 244B through the switches 253B, 254B in the first, second and third phases. Also, the connection point of the capacitors 241B and 243B is connected to an inverting input terminal of the operational amplifier 270 through the switch 261B in the fourth phase. The other terminal of the capacitor 241B is connected to the other terminal of the capacitor 242B through the switch 264B in the first and second phases, and input the input signal Vin+ through the switch 251B in the third phase. Also, the other terminal of the capacitor 241B is connected to a non-inverting output terminal of the operational amplifier 270 through the switch 255B in the fourth phase. The other terminal of the capacitor 243B is connected to the other terminal of the capacitor 244B through the switch 263B in the first and second phases, and input the input signal Vin+ through the switch 257B in the third phase. Also, the other terminal of the capacitor 243B is input a reference voltage through the switch 259B in the fourth phase.

The connection point of the capacitors 242B and 244B is connected to the connection point of the capacitors 241B and 243B through the switches 254B, 253B in the first, second and third phases. Also, the connection point of the capacitors 242B and 244B is connected to a non-inverting input terminal of the operational amplifier 270 through the switch 262B in the fourth phase. The other terminal of the capacitor 242B is connected to the other terminal of the capacitor 241B through the switch 264B in the first and second phases, and input the input signal Vin− through the switch 252B in the third phase. Also, the other terminal of the capacitor 241B is connected to an inverting output terminal of the operational amplifier 270 through the switch 256B in the fourth phase.

The other terminal of the capacitor 244B is connected to the other terminal of the capacitor 243B through the switch 263B in the first and second phases, and input the input signal Vin− through the switch 258B in the third phase. Also, the other terminal of the capacitor 244B is input a reference voltage through the switch 260B in the fourth phase.

The operational amplifier 270 is a fully differential operational amplifier, including an inverting input terminal, a non-inverting input terminal, an inverting output terminal, and a non-inverting output terminal. The inverting input terminal and the non-inverting output terminal of the operational amplifier 270 are connected each other through the switch 261A, the capacitor 241A, and the switch 255A in the second phase. Also, they are connected each other through the switch 261B, the capacitor 241B, and the switch 255B in the fourth phase. On the other hand, the inverting input terminal and the non-inverting output terminal of the operational amplifier 270 are unconnected by turning off the switches 261A, 255A, 261B, 255B in the first and third phases. The non-inverting input terminal and the inverting output terminal of the operational amplifier 270 are connected each other through the switch 262A, the capacitor 242A, and the switch 256A in the second phase. Also, they are connected each other through the switch 262B, the capacitor 242B, and the switch 256B in the fourth phase. On the other hand, the non-inverting input terminal and the inverting output terminal of the operational amplifier 270 are unconnected by turning off the switches 262A, 256A, 262B, 256B in the first and third phases.

The comparator 280 in the first and third phases compares the difference voltage between the input signals Vin+ and Vin− from the previous convert stage with the threshold voltages, and outputs a digital output signal Vd according to the result of the comparison between the difference voltage between the input signals Vin+, Vin− and the threshold voltages. One of the voltages Vrefp, Vcom, Vrefm is selected as a reference voltage in each of switches 259A, 260A, 259B, 260B according to value of the digital output signal Vd in the second and fourth phases. The reference voltages of the switches 259A, 260A are added to at the other terminals of the capacitors 243A, 244A, respectively, in the second phase. Also, the reference voltages of the switches 259B, 260B are added to at the other terminals of the capacitors 243B, 244B, respectively, in the fourth phase.

Next, the behaviors of the convert stage 200-K will be explained according to each phase. As shown in FIG. 8, the convert stage 200-K in the first phase is operating in the sample mode. The convert stage 200-K samples the input signals Vin+, Vin− from the previous convert stage 200-(K−1) in the first phase. The capacitors 241A, 243A sample the input signal Vin+, and the capacitors 242A, 244A sample the input signal Vin− by turning on the switches 251A-254A, 257A, 258A and turning off the switches 255A, 256A, 259A-264A.

Moreover, the comparator 280 compares the difference voltage between the input signals Vin+ and Vin− with the threshold voltages to obtain the digital output signal Vd (n bit) in the first phase.

On the other hand, the capacitors 241B-244B do not sample the input signals Vin+, Vin− during the first phase. One terminal of each of capacitors 241B-244B is connected to other three by turning on the switches 253B, 254B and turning off the switches 261B, 262B. The other terminals of the capacitors 241B, 242B are connected each other by turning on the switch 264B and turning off the switches 251B, 252B, 255B-260B. The other terminals of the capacitors 243B, 244B are connected each other by turning on the switches 263B and turning off the switches 251B, 252B, 255B-260B. As a result, the voltages at both terminals of each of capacitors 241B, 242B, 243B, 244B become equal. Because the capacitances of the capacitors 241B, 242B, 243B, 244B are equal, electric charge in the capacitors 241B, 242B are discharged to be an average voltage at all terminals of capacitors 241B, 242B. Similarly, electric charges in the capacitors 243B, 244B are discharged to be an average voltage at all terminals of capacitors 243B, 244B. At last, since the voltages at all terminals of capacitors 241B-244B become equal, electric charge in the capacitors 241B-244B are all discharged to be an average voltage at all terminals of capacitors 241B-244B. The effect of these discharges will be described later.

As shown in FIG. 9, the convert stage 200-K in the second phase is operating in the hold mode. The capacitors 241A-244A hold the input signals Vin+, Vin− which are sampled in the first phase by turning off the switches 251A, 252A, 257A, 258A. Moreover, reference voltages are input to the other terminals of capacitors 243A, 244A through the switches, 259A, 260A in the second phase. One of the reference voltages is selected according to the digital output signal Vd generated in the first phase. Therefore, flows of the electric charge from the capacitors 241A-244A are caused, and the residual signals are output as output signals Vout+, Vout−. The residual signal is a signal which is generated by voltage difference between the input signals Vin+, Vin− and the reference voltages. These output signals Vout+, Vout− are used as the input signals Vin+, Vin− in the next convert stage 200-(K+1). Other switches 251B-264B operate as same as the first phase.

As shown in FIG. 10, the convert stage 200-K in the third phase is operating in the sample mode. The convert stage 200-K samples the input signals Vin+, Vin− from the previous convert stage 200-(K−1) in the third phase. The capacitors 241B, 243B sample the input signal Vin+, and the capacitors 242B, 244B sample the input signal Vin− by turning on the switches 251B-254B, 257B, 258B and turning off the switches 255B, 256B, 259B-264B. Moreover, the comparator 280 compares the difference voltage between the input signals Vin+ and Vin− with the threshold voltages to obtain the digital output signal Vd.

On the other hand, the capacitors 241A-244A do not sample the input signals Vin+, Vin−. All terminals of capacitors 241A-244A are connected by turning on the switches 253A, 254A, 263A, 264A and turning off the switches 251A, 252A, 255A-262A. As a result, electric charges in the capacitors 241A-244A are discharged to be an average voltage at all terminals of capacitors 241A-244A. Although any one of the capacitors 241A-244A holds more or less electric charge than other three capacitors in the second phase, the voltage at all terminals of capacitors 241A-244A become equal to the common-mode voltage Vcom of the input signals Vin+ and Vin−.

As shown in FIG. 11, the convert stage 200-K in the fourth phase is operating in the hold mode. The capacitors 241B-244B hold the input signals Vin+, Vin− which are sampled in the third phase by turning off the switches 251B, 252B, 257B, 258B. Moreover, the reference voltages are input to other terminals of capacitors 243B, 244B through the switches 259B, 260B in the fourth phase. The reference voltages are according to the digital output signal Vd generated in the third phase. Therefore, flows of the electric charge from the capacitors 241B-244B are caused, and the residual signals are output as output signals Vout+, Vout−. The residual signal is a signal which is generated by voltage difference between the input signals Vin+, Vin− and the reference voltages. These output signals Vout+, Vout− are used as the input signals Vin+, Vin− in the next convert stage 200-(K+1). Other switches 251A-264A operate as same as the third phase.

The convert stage 200-K in the second embodiment performs the first to fourth phases periodically to sample and hold the input signals Vin+, Vin−, and to output the digital output signal Vd. Moreover, the convert stage 200-K outputs the residual signals as the output signals Vout+, Vout− into next convert stage 200-(K+1). As mentioned above, the capacitors 241B-244B in the first and second phases and the capacitors 241A-244A in the third and fourth phases do not sample and hold the input signals Vin+, Vin−. This means that the first capacitor set (including capacitors 241A-244A) and the second capacitor set (including capacitors 241B-244B) are alternately used to sample and hold the input signals Vin+, Vin− in the convert stage 200-K

Next, we will describe the effect of the using two sets of the capacitors, and performing sampling, holding, and discharging, periodically.

Figure 12:
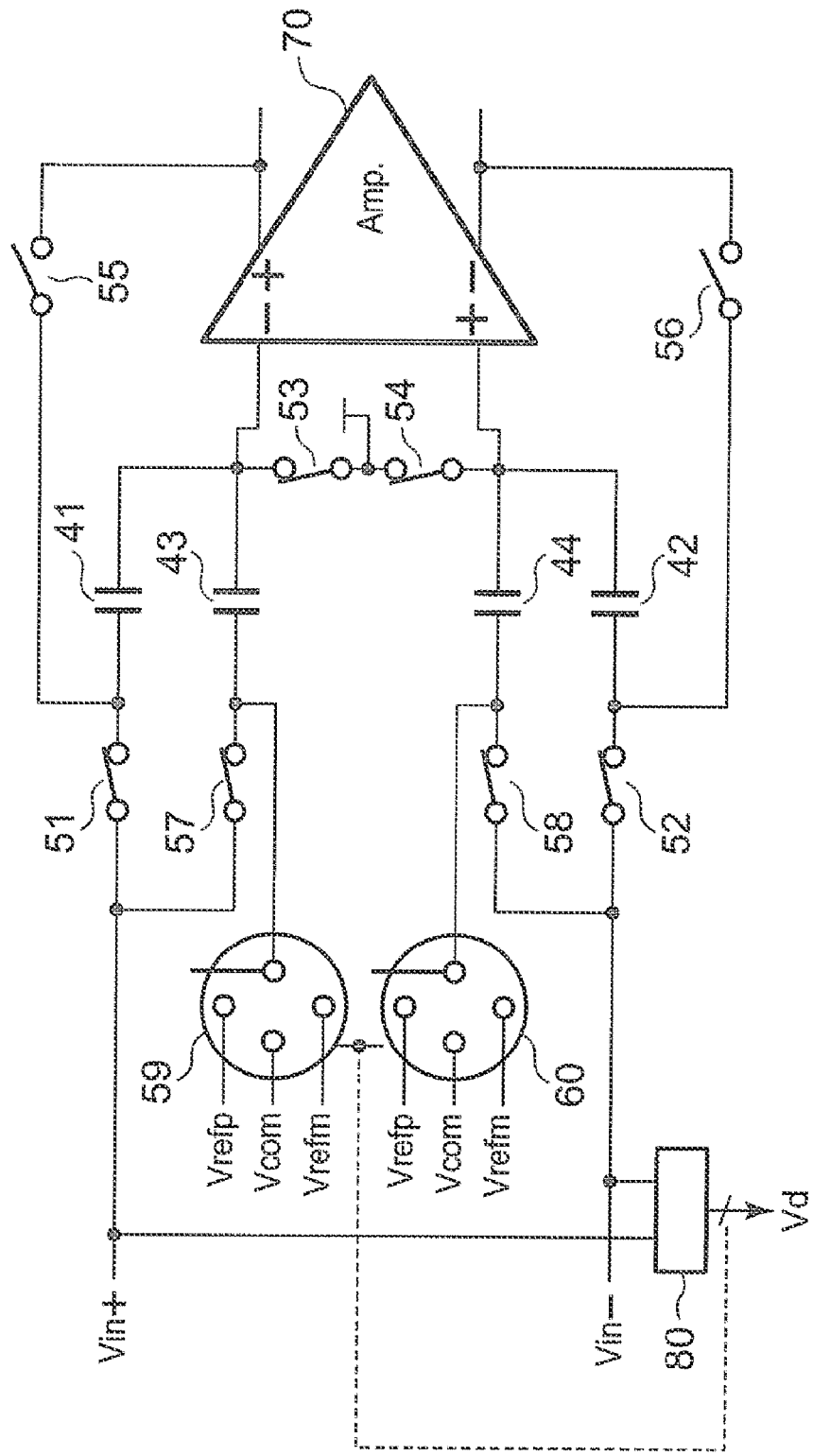
FIG. 12 is a figure explaining a technical point of the convert stage shown in FIGS. 8-11.
Figure 13:
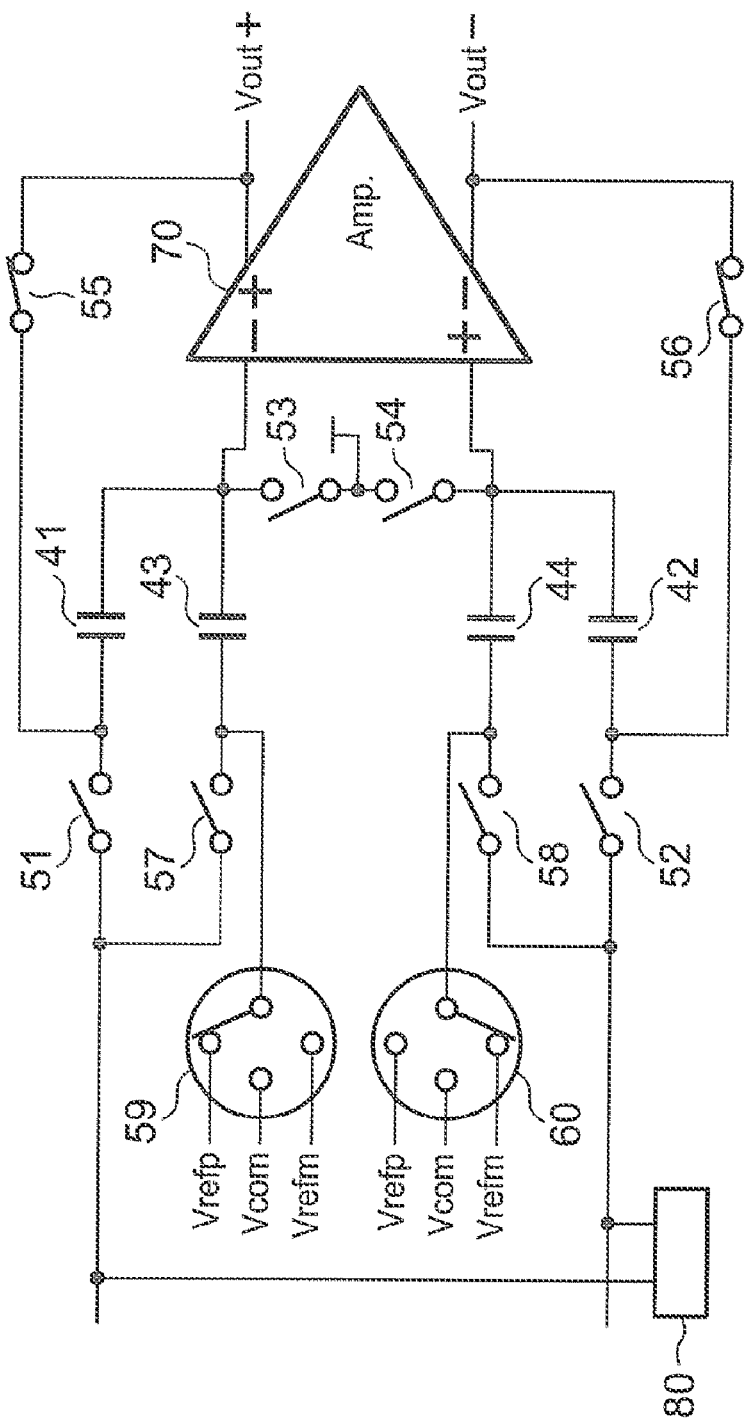
FIG. 13 is another figure explaining a technical point of the convert stage shown in FIGS. 8-11.

As shown in FIG. 12 and FIG. 13, a conventional convert stage has one set of capacitors including capacitors 41-44. The conventional convert stage samples the input signals Vin+, Vin− using the set of capacitors continuously. As shown in FIG. 12, in the sample mode, one terminal of each of the capacitors 41-44 is connected to one terminal of other capacitors. The other terminal of each of the capacitors 41, 43 is input the input signal Vin+ through the switches 51, 57, and the other terminal of each of the capacitors 42, 44 is input the input signal Vin− through the switches 52, 58. The capacitors 41-44 have a same capacitance. A comparator 80 compares the input signals Vin+, Vin− with threshold voltages, and outputs the digital output signal Vd.

As shown in FIG. 13, when the conventional convert stage 200-K outputs the output signals Vout+, Vout− to the next convert stage 200-(K+1), the other terminal of each of the capacitors 41, 43 is unconnected with the input signal Vin+ by turning off the switches 51, 57, and the other terminal of each of the capacitors 42, 44 is also unconnected with the input signal Vin− by turning off the switches 42, 44. The inverting input terminal of the operational amplifier 70 is connected to the non-inverting output terminal through the capacitor 41 and the switch 55. Also, the non-inverting input terminal of the operational amplifier 70 is connected to the inverting output terminal through the capacitor 42 and the switch 56. The reference voltages, which are selected according to the digital output signal Vd, is input to the capacitors 43, 44 through the switches 59, 60. The output signal Vout+ is output from the inverting input terminal of the operational amplifier 70. The output signal Vout− is output from the non-inverting input terminal of the operational amplifier 70. These output signals Vout+, Vout− are residual signals generated by voltage difference between the input signals Vin+, Vin− and the reference voltages, and input into the next convert stage 200-(K+1).

Because the conventional convert stage has only one set of the capacitors, the electric charge which have been held during the hold mode may still remain in the capacitors 41-44 when the next sample mode starts. An example case, that the input signal Vin+ is Vrefp and Vin− is Vrefm in the sample mode (Vrefm<Vrefp), will be considered. The capacitors 41, 43 are charged electric charge from an operational amplifier in the previous convert stage to be Vcom at a terminal and Vrefp at the other terminal. The capacitors 42, 44 are also charged electric charge from the operational amplifier in the previous convert stage to be Vcom at a terminal and Vrefm at the other terminal. Therefore, the output signal Vout+ is Vrefp, and the output signal Vout− is Vrefm in FIG. 13.

In the next sample mode, for example, the input signal Vin+ is Vrefm, and Vin− is Vrefp from the previous convert stage. The capacitors 41, 43 are charged electric charge from the operational amplifier in the previous convert stage to be Vcom at a terminal and Vrefm at the other terminal. The capacitors 42, 44 are also charged electric charge from the operational amplifier in the previous convert stage to be Vcom at a terminal and Vrefp at the other terminal. Because the electric charge in the capacitors 41-44 are held during the previous hold mode, the capacitors 41, 43 needs to discharge to be Vrefm from Vrefp at the other terminal. Also, the capacitors 42, 44 need to charge to be Vrefp from Vrefm at the other terminal.

The convert stage of the A/D converter in the second embodiment discharges the capacitors once before the sample mode. For example, the capacitors 241A-244A in the third and forth phases discharge electric charge which have been held during the second phase. Moreover, the capacitors 241B-244B in the first and second phases discharge electric charge which have been held during the fourth phase. The voltages at all terminals of capacitors 241A-244A, 241B-244B become Vcom before the sample mode, that is first and third phases, starts. Therefore, the amount of electric charge which is required to charge the capacitors 241A-244A, 241B-244B are almost half compared with the conventional convert stage.

As described above, the convert stage of the A/D converter in the second embodiment has two sets of capacitors. One set of capacitors discharges while the other set of capacitors are performing sampling and holding. Therefore, the A/D converter in the second embodiment decreases the amount of electric charge to be used for charge compared with the conventional A/D converter. As a result, the A/D converter in the second embodiment decreases the consumption power.

Figure 14:
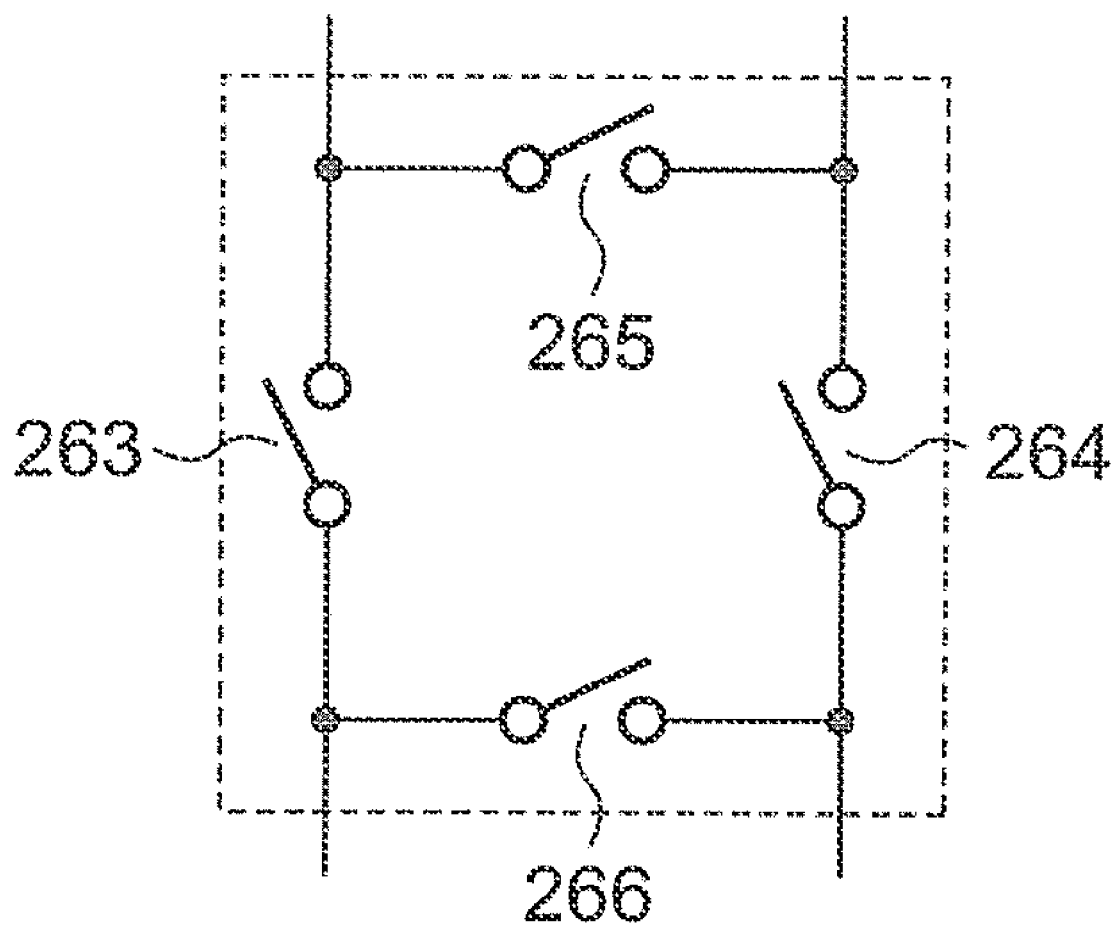
FIG. 14 is a block diagram showing alternate switches for them inside dotted frames in FIGS. 8-11.

The switches 263A, 264A inside the dotted frame in FIGS. 8-11 could be replaced with the switches 263-264 inside the dotted frame in FIG. 14. Similarly, the switches 263B, 264B inside the dotted frame in FIGS. 8-11 could also be replaced with the switches 263-264 inside the dotted frame in FIG. 14. All switches 263-266 are turned on/off simultaneously. The advantages of using switches 265, 266 in addition to switches 263, 264 are described below.

In the second embodiment, all capacitors 241-244 have a same capacitance. However, actually, the capacitances of the capacitors 241-244 may not be equal because of a distortion in the manufacturing process. Because the amounts of electric charge in the capacitors 241-244 are different when they have different capacitances, it may be difficult to discharge to completely average the electric charges in the capacitors 241-244. Since all capacitors 241-244 are connected with more branches through switches 265, 266, the electric charges in the capacitors 241-244 are averaged more easily by using switches 265, 266.

Description of the Third Embodiment

While we explained a S/H circuit which samples and holds one analog input signal in the first embodiment, we will explain a S/H circuit which samples and holds two analog input signals in the third embodiment. Generally, using two S/H circuits in the first embodiment may be considered to sample and hold two analog input signals. This means that two sets of capacitors are required for each S/H circuit. Therefore, total four sets of capacitors are required. On the other hand, a S/H circuit in the third embodiment uses only three sets of capacitors to sample and hold two analog input signals.

Figure 15:
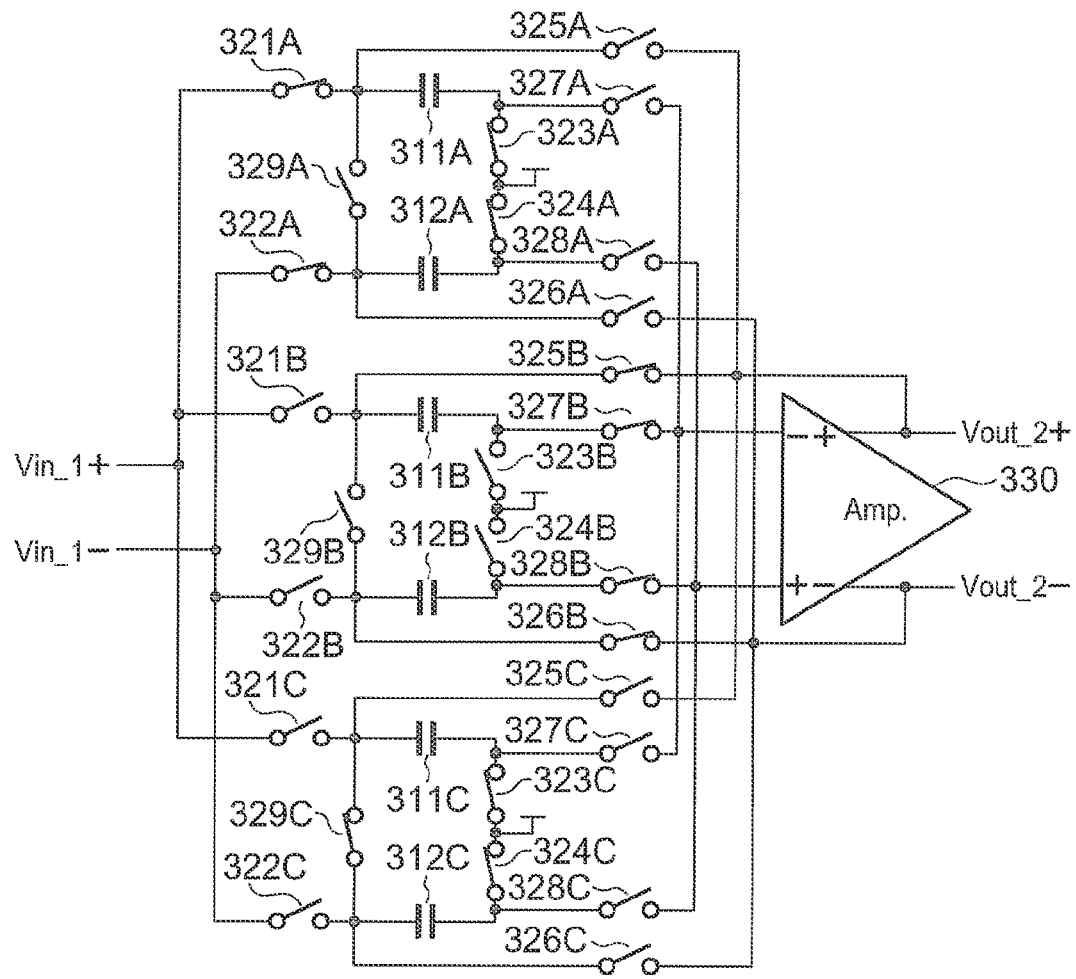
FIG. 15 is a block diagram showing a S/H circuit in the first phase according to the third embodiment.

As shown in FIG. 15, a S/H circuit in the third embodiment includes capacitors 311A, 312A (hereinafter, referred to as "first capacitor set"), switches 321A-329A, other capacitors 311B, 312B (hereinafter, referred to as "second capacitor set"), other switches 321B-329B, other capacitors 311C, 312C (hereinafter, referred to as "third capacitor set"), other switches 321C-329C, and an operational amplifier 330. Each of capacitors 311A, 312A, 311B, 312B, 311C, and 312C has a same capacitance.

Figure 16:
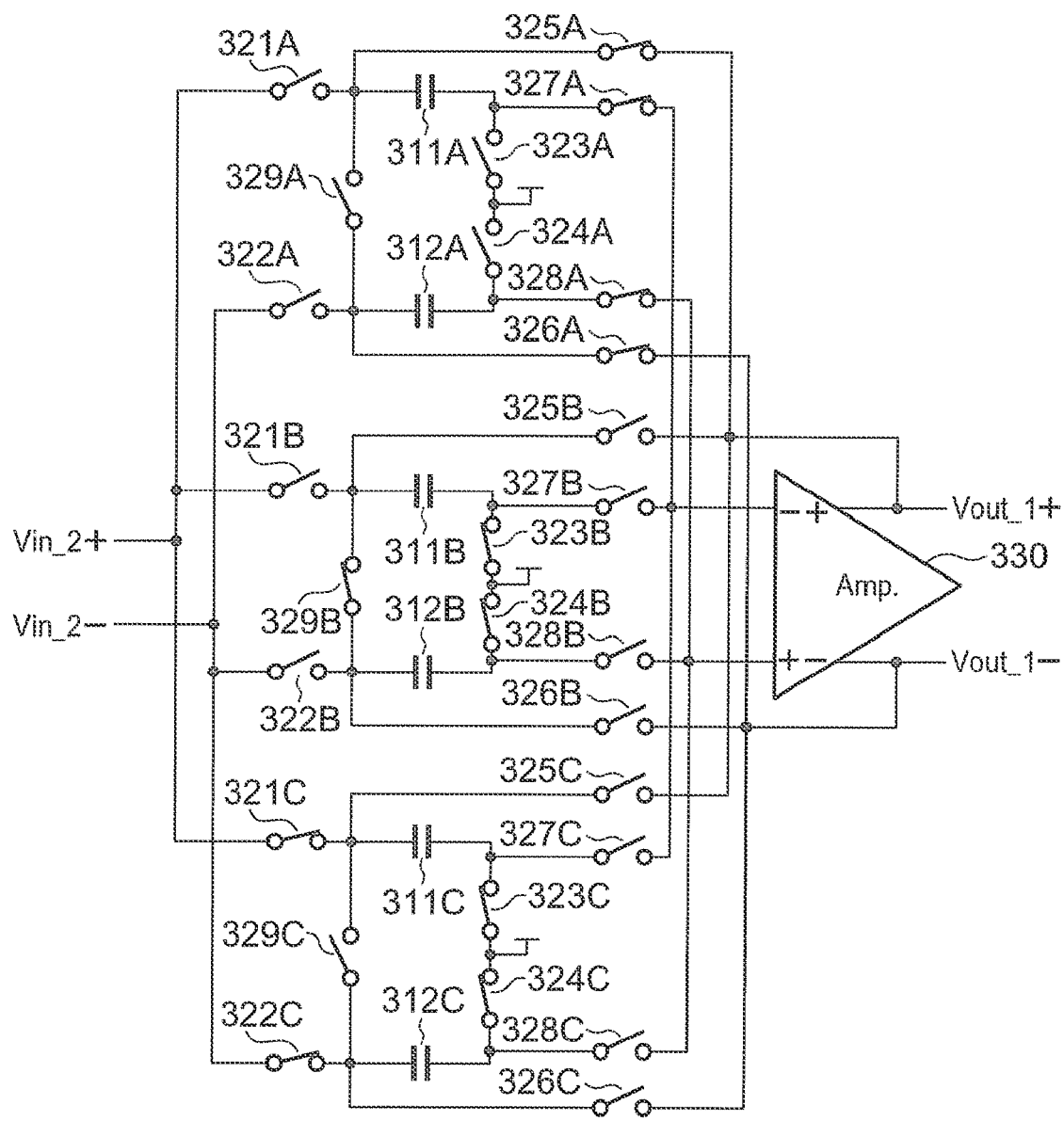
FIG. 16 is a block diagram showing the S/H circuit in the second phase.
Figure 17:
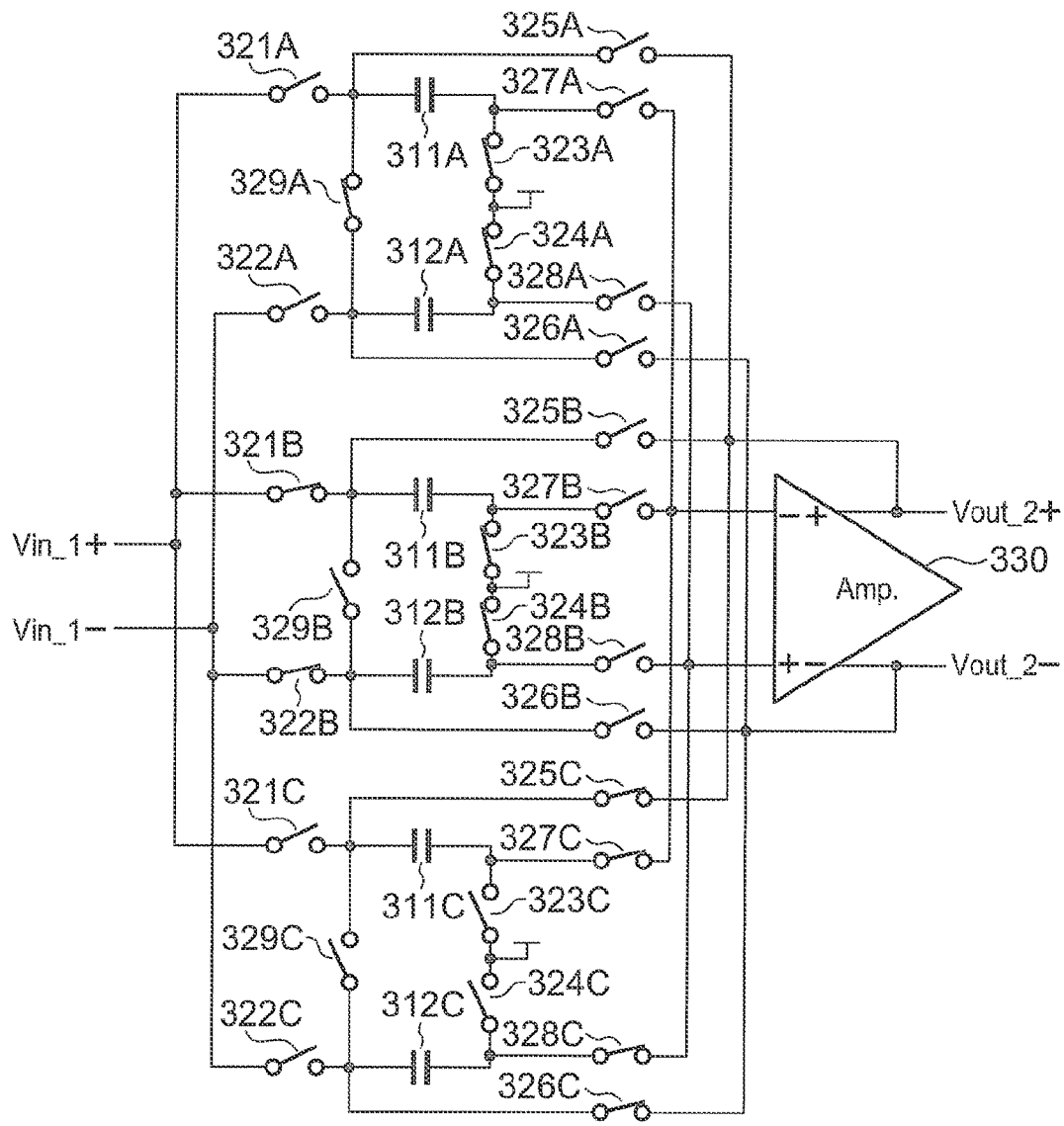
FIG. 17 is a block diagram showing the S/H circuit in the third phase.
Figure 18:
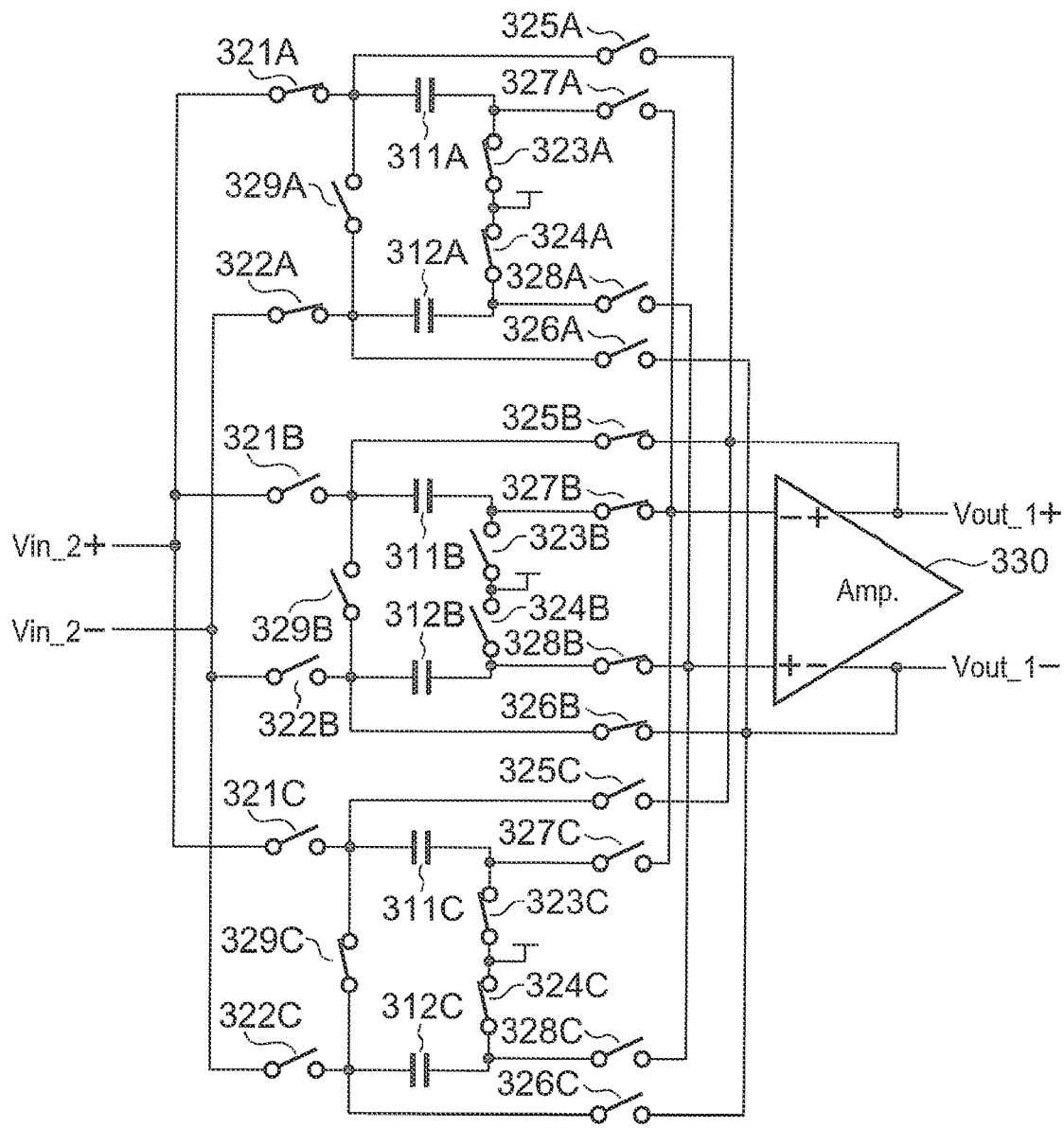
FIG. 18 is a block diagram showing the S/H circuit in the fourth phase.
Figure 19:
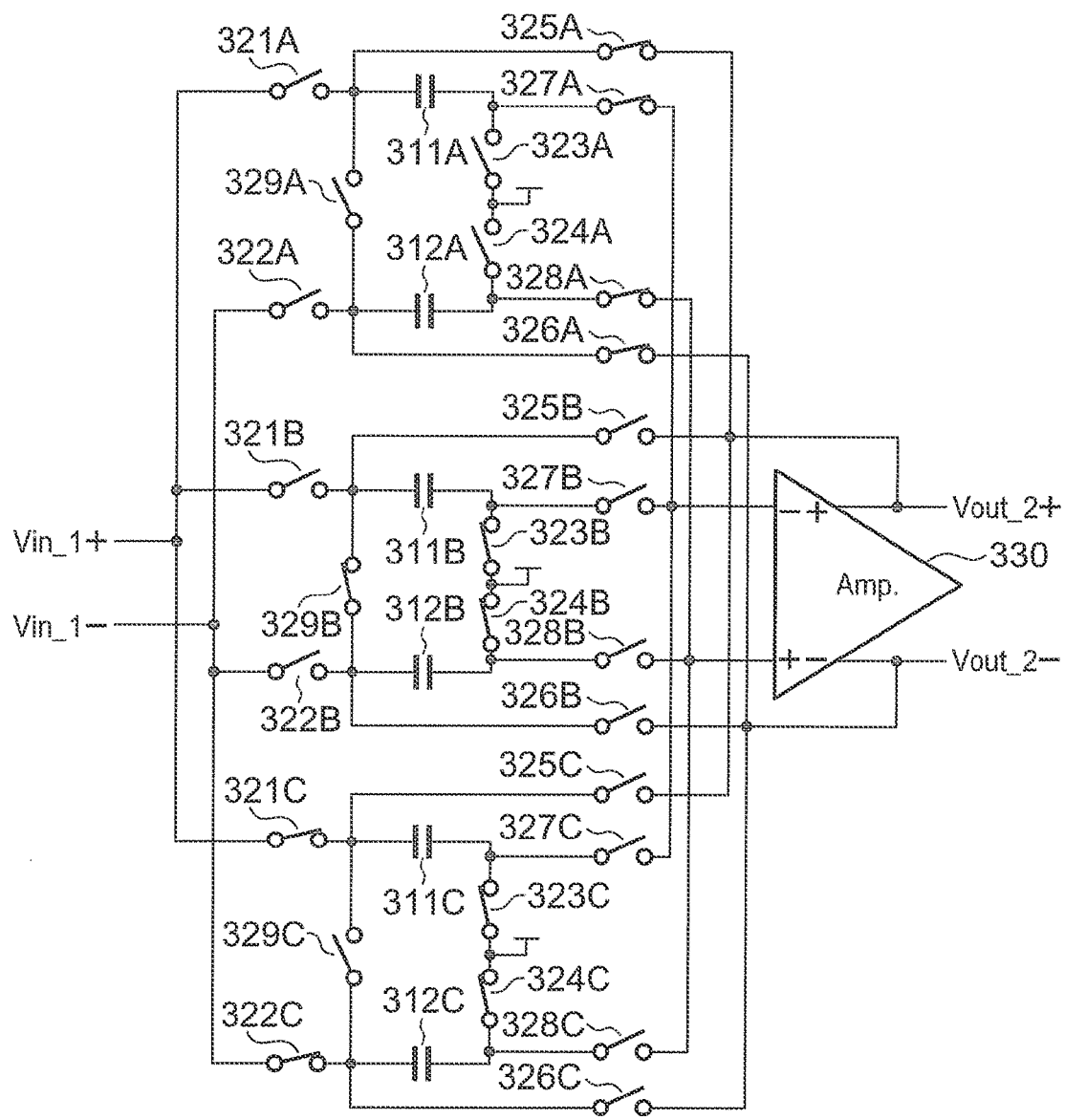
FIG. 19 is a block diagram showing the S/H circuit in the fifth phase.
Figure 20:
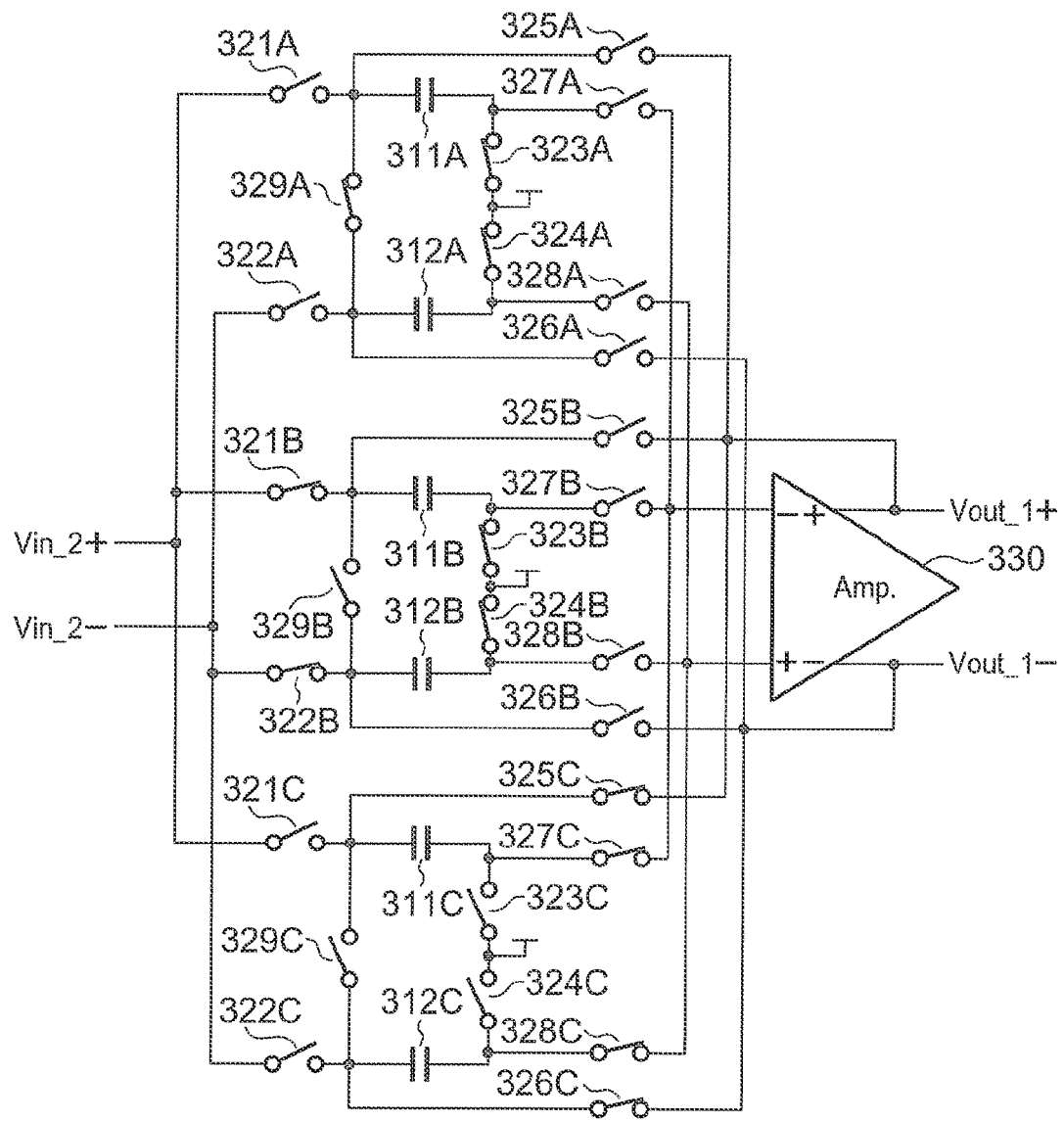
FIG. 20 is a block diagram showing the S/H circuit in the sixth phase.

The S/H circuit samples and holds two analog input signals. The S/H circuit realizes several behaviors (such as, a sample mode and a hold mode) by switching due to the switches 321A-329A, 321B-329B and 321C-329C. These behaviors are classified in six phases based on connection status of switches as shown in FIGS. 15-20, respectively. The first phase shown in FIG. 15 is the sample mode for the input signals Vin_1+, Vin_1− using the first capacitor set, and the hold mode for the input signals Vin_2+, Vin_2− using the second capacitor set. The second phase shown in FIG. 16 is the hold mode for the input signals Vin_1+, Vin_1− using the first capacitor set, and the sample mode for the input signals Vin_2+, Vin_2− using the third capacitor set. FIG. 17 is the sample mode for the input signals Vin_1+, Vin_1− using the second capacitor set, and the hold mode for the input signals Vin_2+, Vin_2− using the third capacitor set. The fourth phase shown in FIG. 18 is the hold mode for the input signals Vin_1+, Vin_1− using the second capacitor set, and the sample mode for the input signals Vin_2+, Vin_2− using the first capacitor set. The fifth phase shown in FIG. 19 is the sample mode for the input signals Vin_1+, Vin_1− using the third capacitor set, and the hold mode for the input signals Vin_2+, Vin_2− using the first capacitor set. The sixth phase shown in FIG. 20 is the hold mode for the input signals Vin_1+, Vin_1− using the third capacitor set, and the sample mode for the input signals Vin_2+, Vin_2− using the second capacitor set. The S/H circuit in the first embodiment performs the first to sixth phases periodically to sample and hold the input signals Vin_1+, Vin_1−, Vin_2+, Vin_2−.

The S/H circuit performs sampling the first input signals Vin_1+, Vin_1− and holding the second input signals Vin_2+, Vin_2−, simultaneously, in the first, third and fifth phases. Also, the S/H circuit performs holding the first input signals Vin_1+, Vin_1− and sampling the second input signals Vin_2+, Vin_2−, simultaneously, in the second, fourth and sixth phases. The first input signals and the second input signals can share an operational amplifier 330 in the S/H circuit, because the first input signals and the second input signals are processed in different modes at a given time. The signals Vin_1+, Vin_1−, Vin_2+, Vin_2−, Vout_1+, Vout_1−, Vout_2+, and Vout_2− are all analog. Moreover, the minimum voltage of these signals is Vrefm, and the maximum voltage is Vrefp. The common-mode voltage of the input signals Vin+, Vin− is Vcom (=(Vin_1++Vin_1−)/2= (Vin_2++Vin_2−)/2).

One terminal of the capacitor 311A is connected to a terminal of the capacitor 312A through the switches 323A, 324A in the first, third, fourth and sixth phases, and connected to an inverting input terminal of the operational amplifier 330 through the switch 327A in the second and fifth phases. The other terminal of the capacitor 311A is input the input signal Vin_1+ through the switch 321A in the first phase, and connected to a non-inverting output terminal of the operational amplifier 330 through the switch 325A in the second and fifth phase. Also, the other terminal of the capacitor 311A is connected to the other terminal of the capacitor 312A through the switch 329A in the third and sixth phases, and input the input signal Vin_2+ through the switch 321A in the fourth phase.

One terminal of the capacitor 312A is connected to a terminal of the capacitor 311A through the switches 324A, 323A in the first, third, fourth and sixth phases, and connected to a non-inverting input terminal of the operational amplifier 330 through the switch 328A in the second and fifth phases. The other terminal of the capacitor 312A is input the input signal Vin_1– through the switch 322A in the first phase, and connected to a inverting output terminal of the operational amplifier 330 through the switch 326A in the second and fifth phases. Also, the other terminal of the capacitor 312A is connected to the other terminal of the capacitor 311A through the switch 329A in the third and sixth phases, and input the input signal Vin_2– through the switch 322A in the fourth phase.

One terminal of the capacitor 311B is connected to an inverting input terminal of the operational amplifier 330 through the switch 327B in the first and fourth phases, and connected to a terminal of the capacitor 312B through the switches 323B, 324B in the second, third, fifth and sixth phases. The other terminal of the capacitor 311B is connected to a non-inverting output terminal of the operational amplifier 330 through the switch 325B in the first and fourth phases, and connected to the other terminal of the capacitor 312B through the switch 329B in the second and fifth phases. Also, the other terminal of the capacitor 311B is input the input signal Vin_1+ through the switch 321B in the third phase, and input the input signal Vin_2+ through the switch 321B in the sixth phase.

One terminal of the capacitor 312B is connected to a non-inverting input terminal of the operational amplifier 330 through the switch 328B in the first and fourth phases, and connected to a terminal of the capacitor 311B through the switches 324B, 323B in the second, third, fifth and sixth phases. The other terminal of the capacitor 312B is connected to an inverting output terminal of the operational amplifier 330 through the switch 326B in the first and fourth phases, and connected to the other terminal of the capacitor 311B through the switch 329B in the second and fifth phases. Also, the other terminal of the capacitor 312B is input the input signal Vin_1– through the switch 322B in the third phase, and input the input signal Vin_2– through the switch 322B in the sixth phase.

One terminal of the capacitor 311C is connected to a terminal of the capacitor 312C through the switches 323C, 324C in the first, second, fourth and fifth phases, and connected to an inverting input terminal of the operational amplifier 330 through the switch 327C in the third and sixth phases. The other terminal of the capacitor 311C is connected to the other terminal of the capacitor 312C through the switch 329C in the first and fourth phases, and input the input signal Vin_2+ through the switch 321C in the second phase. Also, the other terminal of the capacitor 311C is connected to a non-inverting output terminal of the operational amplifier 330 through the switch 325C in the third and sixth phases, and input the input signal Vin_1+ through the switch 321C in the fifth phase.

One terminal of the capacitor 312C is connected to a terminal of the capacitor 311C through the switches 324C, 323C in the first, second, fourth and fifth phases, and connected to a non-inverting input terminal of the operational amplifier 330 through the switch 328C in the third and sixth phases. The other terminal of the capacitor 312C is connected to the other terminal of the capacitor 311C through the switch 329C in the first and fourth phases, and input the input signal Vin_2– through the switch 322C in the second phase. Also, the other terminal of the capacitor 312C is connected to an inverting output terminal of the operational amplifier 330 through the switch 326C in the third and sixth phases, and input the input signal Vin_1– through the switch 322C in the fifth phase.

The operational amplifier 330 is a fully differential operational amplifier, including an inverting input terminal, a non-inverting input terminal, an inverting output terminal, and a non-inverting output terminal. The inverting input terminal and the non-inverting output terminal of the operational amplifier 330 are connected each other through the switch 327B, the capacitor 311B, and the switch 325B in the first and fourth phases. Also, they are connected each other through the switch 327A, the capacitor 311A, and the switch 325A in the second and fifth phases. Moreover, they are connected each other through the switch 327C, the capacitor 311C, and the switch 325C in the third and sixth phases.

On the other hand, the non-inverting input terminal and the inverting output terminal of the operational amplifier 330 are connected each other through the switch 328B, the capacitor 312B, and the switch 326B in the first and fourth phases. Also, they are connected each other through the switch 328A, the capacitor 312A, and the switch 326A in the second and fifth phases. Moreover, they are connected each other through the switch 328C, the capacitor 312C, and the switch 326C in the third and sixth phases.

The behaviors of the S/H circuit in the third embodiment will be explained according to each phase. Note that the behaviors of the S/H circuit in the fourth to sixth phases in FIGS. 18-20 are same as these in the first to third phases in FIGS. 15-17, except that the signals Vin_1+, Vin_Vout_1+, and Vout_1– in the first to third phases are replaced with the signals Vin_2+, Vin_2–, Vout_2+, and Vout_2– in the fourth to sixth phases. Therefore, explanations for the fourth to sixth phases are skipped.

As shown in FIG. 15, the S/H circuit in the first phase is operating in the sample mode for the input signals Vin_1+, Vin_1–. The capacitors 311A, 312A sample the input signals Vin_1+, Vin_1– by turning on the switches 321A-324A and turning off the switches 325A-329A.

At the same time, the S/H circuit in the first phase is operating in the hold mode for the input signals Vin_2+, Vin_2–, which are sampled by the capacitors 311B, 312B in the previous sixth phase. The input signals Vin_2+, Vin_2– are held by turning off the switches 321B-324B, 329B. Then, these held signals Vin_2+, Vin_2– are output as the output signals Vout_2+, Vout_2– by turning on the switches 325B-328B.

Both terminals of each of capacitors 311C, 312C are connected by turning on the switches 323C, 324C, 329C and turning off the switches 321C, 322C, 325C-328C. As a result, electric charges in the capacitors 311C, 312C are discharged to be an average voltage at all terminals of capacitors 311C, 312C. The effect of this discharge has already described in the first embodiment.

As shown in FIG. 16, the S/H circuit in the second phase is operating in the sample mode for the input signals Vin_2+, Vin_2−. The capacitors 311C, 312C sample the input signals Vin_2+, Vin_2− by turning on the switches 321C-324C and turning off the switches 325C-329C.

At the same time, the S/H circuit in the second phase is operating in the hold mode for the input signals Vin_1+, Vin_−, which are sampled by the capacitors 311A, 312A in the previous first phase. The input signals Vin_1+, Vin_1− are held by turning off the switches 321A-324A, 329A. Then, these held signals Vin_1+, Vin_1− are output as the output signals Vout_1+, Vout_1− by turning on the switches 325A-328A.

Both terminals of each of capacitors 311B, 312B are connected by turning on the switches 323B, 324B, 329B and turning off the switches 321B, 322B, 325B-328B. As a result, electric charges in the capacitors 311B, 312B are discharged to be an average voltage at all terminals of capacitors 311B, 312B.

As shown in FIG. 17, the S/H circuit in the third phase is operating in the sample mode for the input signals Vin_1+, Vin_1−. The capacitors 311B, 312B sample the input signals Vin_1+, Vin_1− by turning on the switches 321B-324B and turning off the switches 325B-329B.

At the same time, the S/H circuit in the third phase is operating in the hold mode for the input signals Vin_2+, Vin_2−, which are sampled by the capacitors 311C, 312C in the previous second phase. The input signals Vin_2+, Vin_2− are held by turning off the switches 321C-324C, 329C. Then, these held signals Vin_2+, Vin_2− are output as the output signals Vout_2+, Vout_2− by turning on the switches 325C-328C.

Both terminals of each of capacitors 311A, 312A are connected by turning on the switches 323A, 324A, 329A and turning off the switches 321A, 322A, 325A-328A. As a result, electric charges in the capacitors 311A, 312A are discharged to be an average voltage at all terminals of capacitors 311A, 312A.

The S/H circuit in the third embodiment discharges the capacitors once before the sample mode. It is same as the S/H circuit in the first embodiment. For example, before sampling the input signals Vin_1+, Vin_1− in the first phase, the capacitors 311A, 312A have discharged electric charge which had been held during the fifth phase by connecting between both terminals of the capacitors 311A and 312A in the sixth phase. Similarly, before sampling the input signals Vin_2+, Vin_2− in the second phase, the capacitors 311C, 312C have discharged electric charge which had been held during the sixth phase by connecting between both terminals of the capacitors 311C and 312C in the first phase. Moreover, before sampling the input signals Vin_1+, Vin_1− in the third phase, the capacitors 311B, 312B have discharged electric charge which had been held during the first phase by connecting between both terminals of the capacitors 311B and 312B in the second phase. Therefore, the S/H circuit in the third embodiment can decreases the consumption power as same as the first embodiment. In addition to the effect, the S/H circuit in the third embodiment realizes reduction of the circuit size. Because the S/H circuit samples and holds two analog input signals with using three sets of capacitors. It can be eliminated one set of capacitors compared with the case of using two S/H circuits which include four sets of capacitors in the first embodiment for two analog input signals.

Description of the Fourth Embodiment

Figure 21:
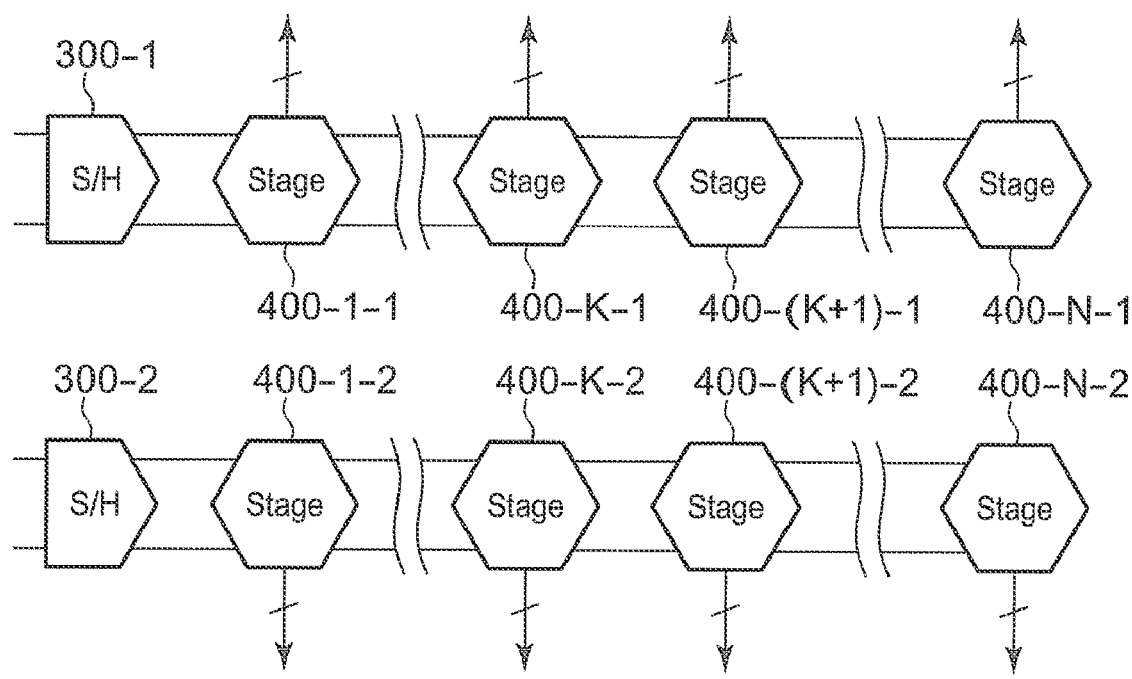
FIG. 21 is a block diagram showing an A/D converter according to the fourth embodiment.

While we explained an A/D converter using a S/H circuit (MDAC) for an analog input signal in the second embodiment, we will explain an A/D converter using a S/H circuit (MDAC) for two analog input signals in the fourth embodiment. An A/D converter in the fourth embodiment is a pipeline A/D converter. As shown in FIG. 21, generally, using two A/D converters in the second embodiment may be considered for two analog input signals. The pipeline A/D converter includes a S/H circuit 300-1, cascaded N convert stages 400-1-1, . . . , 400-K-1, . . . , 400-N-1, another S/H circuit 300-2, and another cascaded N convert stages 400-1-2, . . . , 400-K-2, . . . , 400-N-2. The S/H circuit 300-1 and the cascaded N convert stages 400-1-1, . . . , 400-K-1, . . . , 400-N-1 are used for an analog to digital conversion of a first analog input signal. The S/H circuit 300-2 and the cascaded N convert stages 400-1-2, . . . , 400-K-2, . . . , 400-N-2 are used for an analog to digital conversion of a second analog input signal. For example, if each convert stage has two sets of capacitors, total four sets of capacitors are required for convert stages 400-K-1, 400-K-2. On the other hand, A/D converter in the fourth embodiment uses only three sets of capacitors for two analog input signals. Although the convert stages 400-1-1, . . . , 400-N-1, and 400-1-2, . . . , 400-N-2 are drawn separately in FIG. 21, actually, these convert stages shared a part of components as shown in FIGS. 22-27.

The S/H circuits 300-1, 300-2 may be same as the S/H circuit in the first or third embodiment. In the time=t, the first analog input signal is sampled by the S/H circuit 300-1. Moreover, the S/H circuit 300-1 supplies the sampled first analog input signal into the first convert stage 400-1-1. The first convert stage 400-1-1 compares the voltage of the first analog input signal with threshold voltages, and converts the first analog input signal to a first digital output signal obtained according to a result of the comparison between the voltage of the first analog input signal and the threshold voltages. The digital output signal may have n bit-wide (n≧1) including redundancy bits. In the next time=t+1, the first convert stage 400-1-1 outputs the first analog residual signal to the second convert stage 400-2-1. The analog residual signal is also obtained according to the results of the comparison between the voltage of the first analog input signal and the threshold voltages. Similarly, the second analog input signal is sampled by the S/H circuit 300-2. Moreover, the S/H circuit 300-2 supplies the sampled second analog input signal into the first convert stage 400-1-2. The first convert stage 400-1-2 compares the voltage of the second analog input signal with threshold voltages, and converts the second analog input signal to a second digital output signal obtained according to a result of the comparison between the voltage of the second analog input signal and the threshold voltages. The digital output signal may also have n bit-wide (n≧1) including redundancy bits. In the same time=t+1, the second convert stage 400-2-1 converts the first analog residual signal from the first convert stage 400-1-1 to first digital output signal. Similarly, the first convert stage 400-1-2 outputs the second analog residual signal to the second convert stage 400-2-2. In the next time=t+2, the second convert stage 400-2-1 outputs the first analog residual signal to the third convert stage 400-3-1. Similarly, the second convert stage 400-2-2 converts the second analog residual signal from the first convert stage 400-1-2 to second digital output signal. Other convert stages 400-3-1, ..., 400-N-1, and 400-3-2, ..., 400-N-2 work as same as the first and second convert stages 400-1-1, 400-2-1, and 400-1-2, 400-2-2. At last, these digital output signals from 400-1-1, ..., 400-N-1, and 400-1-2, ..., 400-N-2 are combined to obtain first and second digital signals with Mbit-wide (N≦M≦n×N). This means that the pipeline A/D converter has finished analog to digital conversion for the first and second analog input signals.

Next, we will explain the Kth convert stages 400-K–1, 400-K–2, which are one of the convert stages 400-1-1, ..., 400-N-1, and 400-1-2, ..., 400-N-2, respectively, in the A/D converter. Although the convert stages 400-1-1, ..., 400-N-1, and 400-1-2, ..., 400-N-2 are separated in FIG. 21, actually, these convert stages shared a part of components as shown in FIGS. 22-27. Hereinafter, "convert stage 400-K" means both of "convert stage 400-K–1" and "convert stage 400-K–2".

Figure 22:
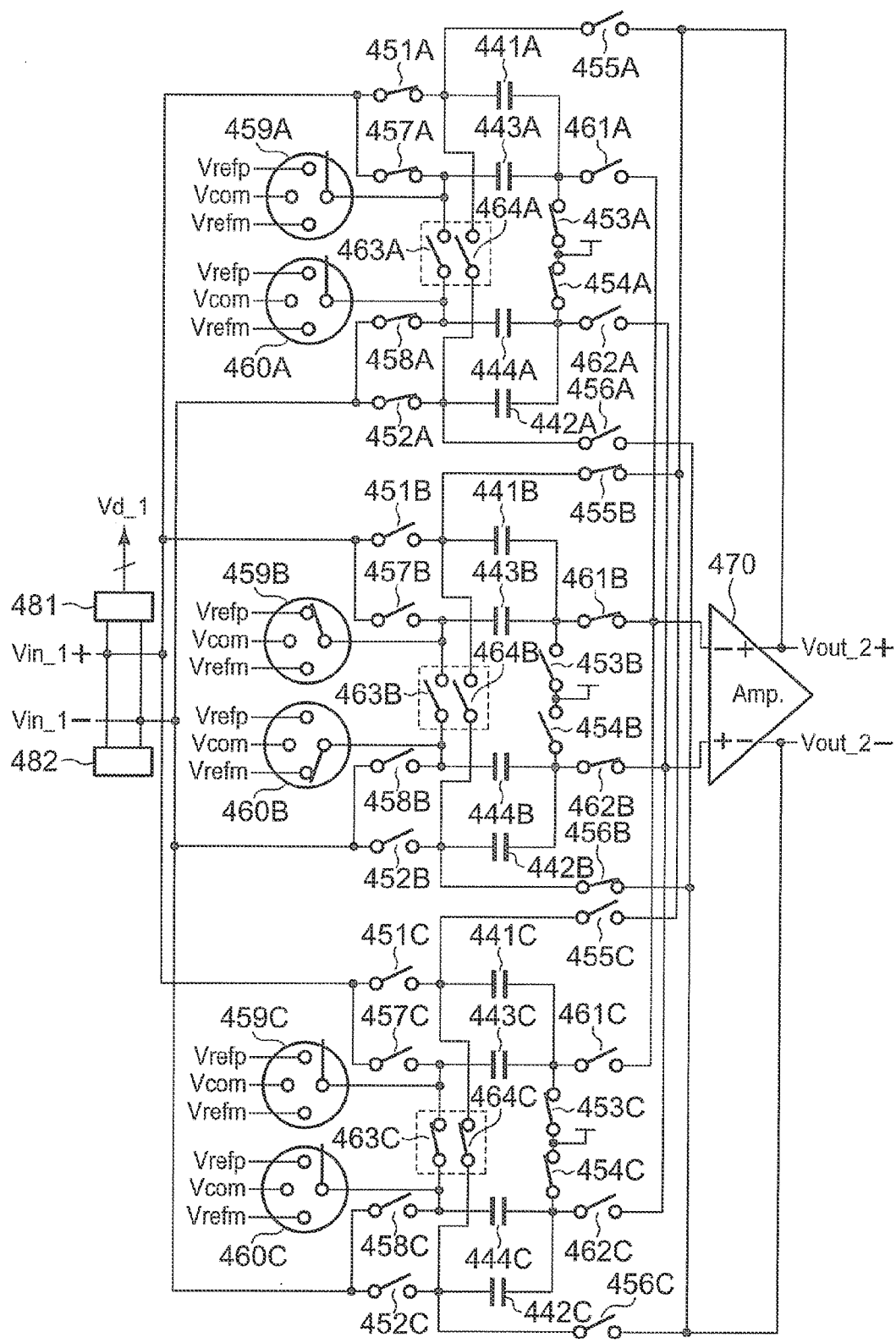
FIG. 22 is a block diagram showing a convert stage of the A/D converter in the first phase.

As shown in FIG. 22, the convert stage 400-K includes capacitors 441A-444A (hereinafter, referred to as "first capacitor set"), other capacitors 441B-444B (hereinafter, referred to as "second capacitor set"), other capacitors 441C-444C (hereinafter, referred to as "third capacitor set"), switches 451A-464A, other switches 451B-464B, other switches 451C-464C, an operational amplifier 470, and comparators 481, 482. Each of capacitors 441A-444A, 441B-444B, and 441C-444C has a same capacitance. The capacitors 441A-444A, 441B-444B, 441C-444C, the switches 451A-464A, 451B-454B, 451C-464C and the operational amplifier 470 provide for a S/H circuit (MDAC). In FIGS. 22-27, input signals Vin_1+, Vin_Vin_2+, Vin_2– are the analog residual signal from the previous convert stage 400-(K–1), and output signals Vout_2+, Vout_2–, Vout_1+, Vout_1– are the analog residual signal to the next convert stage 400-(K+1). Vd_1 from the comparator 481 and Vd_2 from the comparator 482 are digital output signals. The threshold voltages (not shown) are set in the comparators 481, 482. Moreover, actually, the comparators 481, 482 are connected (not shown in FIGS. 22-27) to the switches 459A, 460A, 459B, 460B, 459C, and 460C to indicate value of the digital output signals Vd_1, Vd_2.

Figure 23:
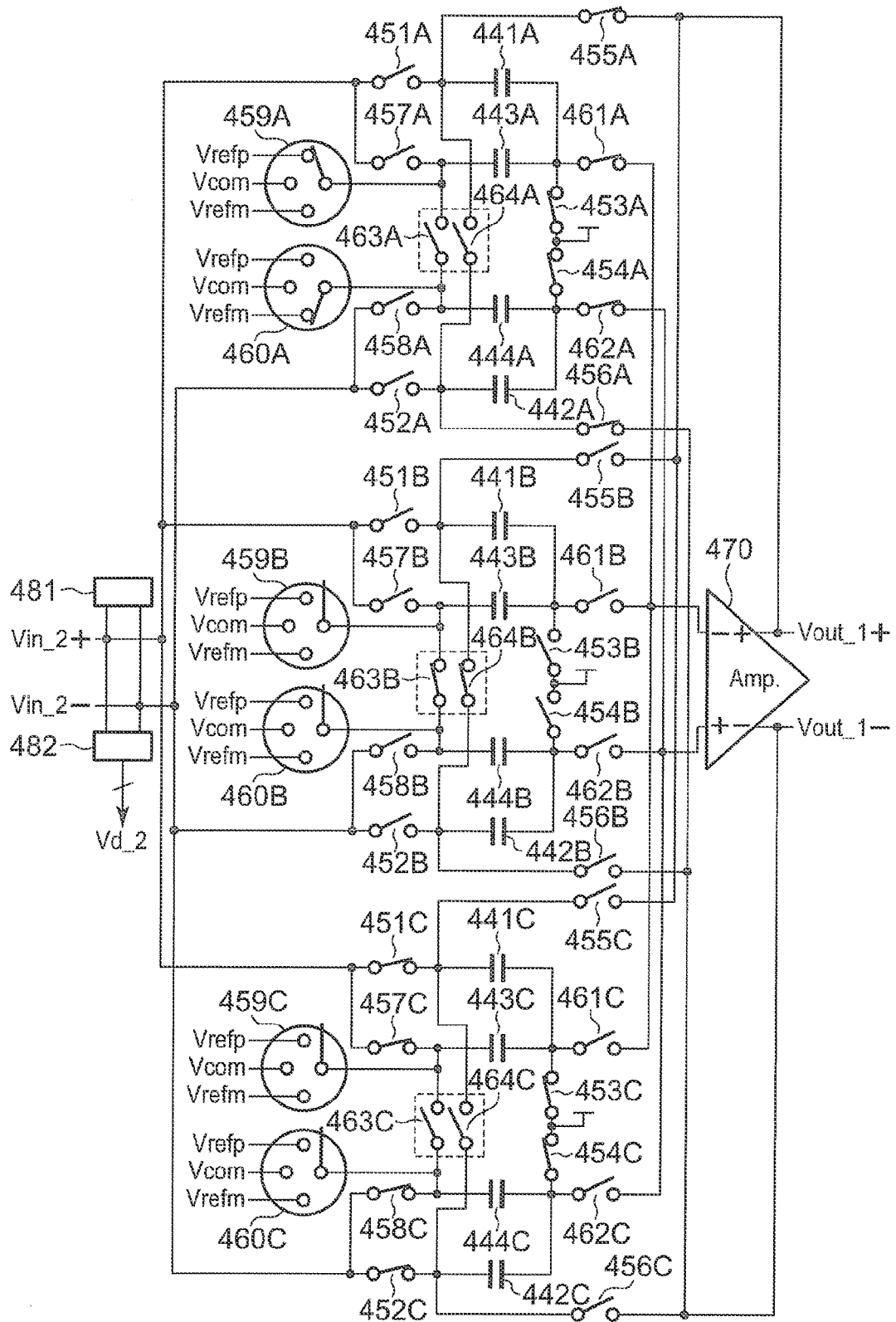
FIG. 23 is a block diagram showing the convert stage of the A/D converter in the second phase.
Figure 24:
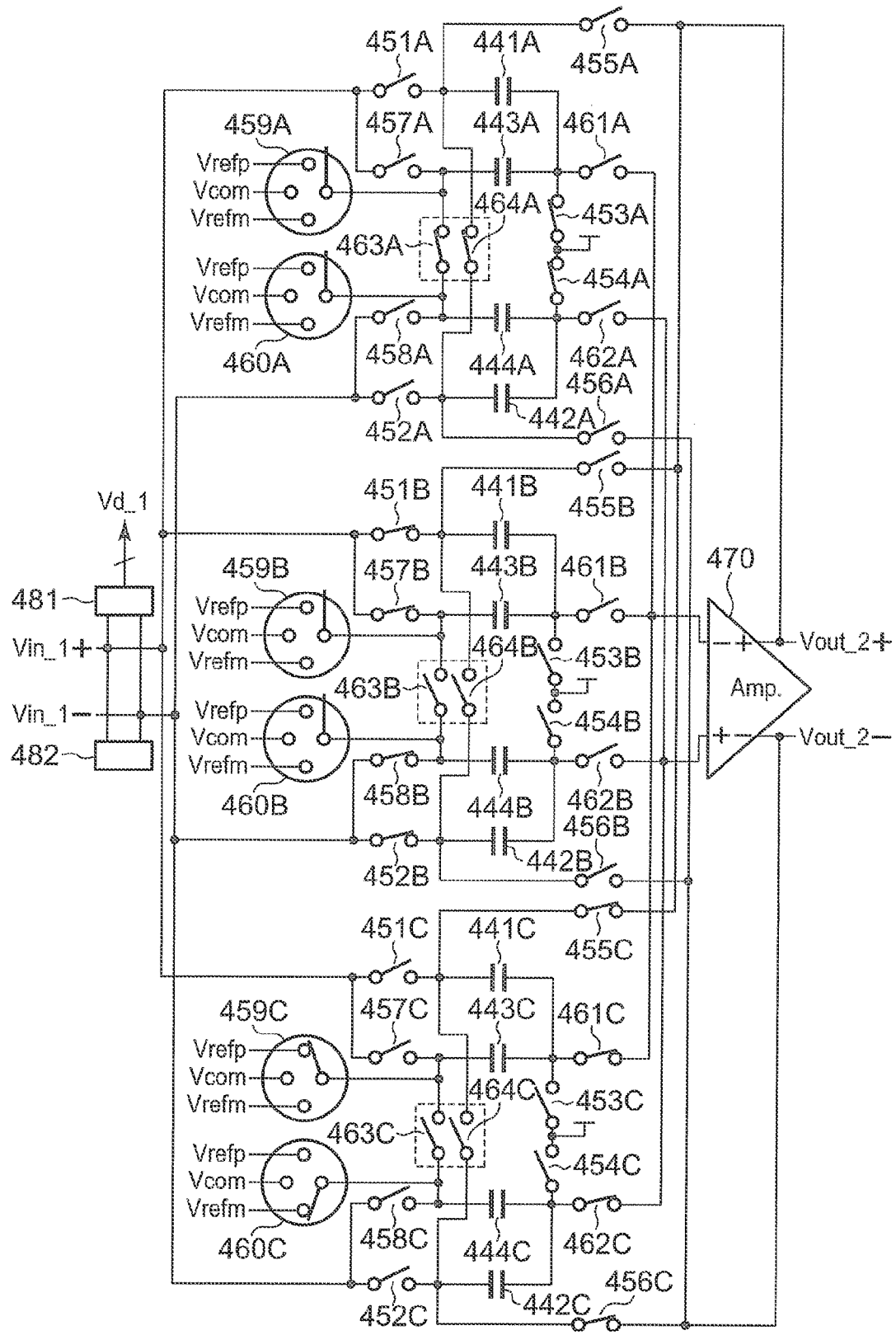
FIG. 24 is a block diagram showing the convert stage of the A/D converter in the third phase.
Figure 25:
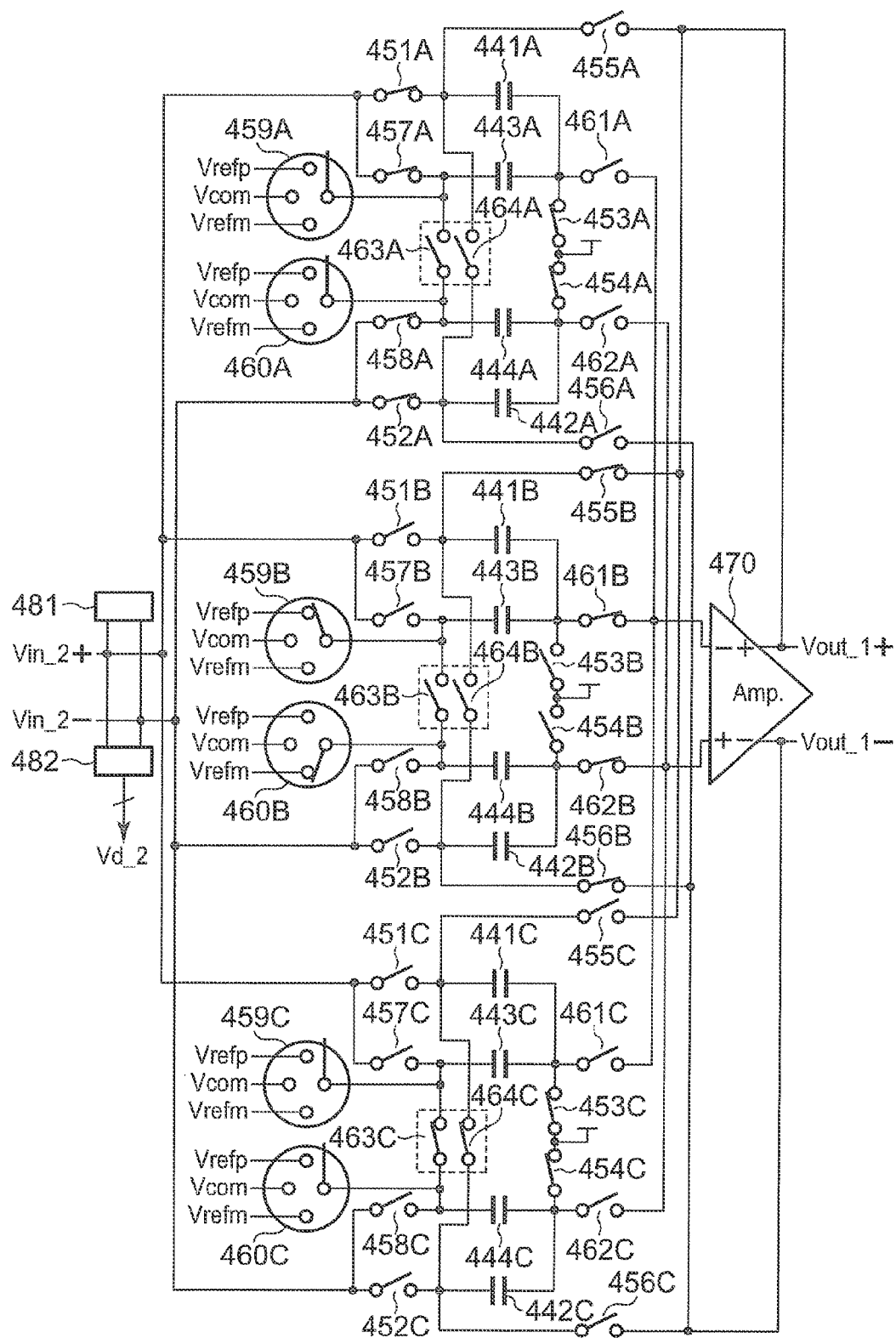
FIG. 25 is a block diagram showing the convert stage of the A/D converter in the fourth phase.
Figure 26:
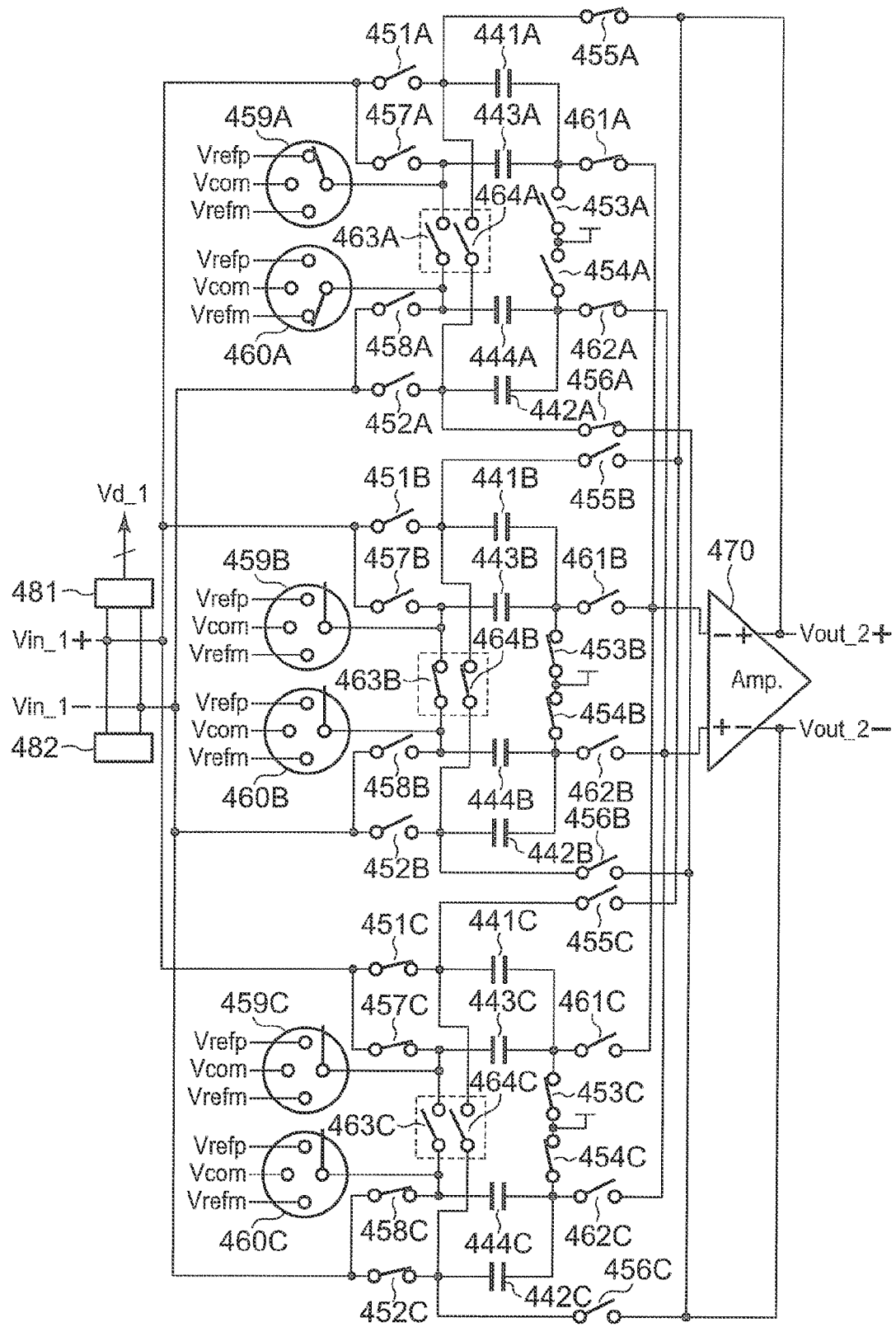
FIG. 26 is a block diagram showing the convert stage of the A/D converter in the fifth phase.
Figure 27:
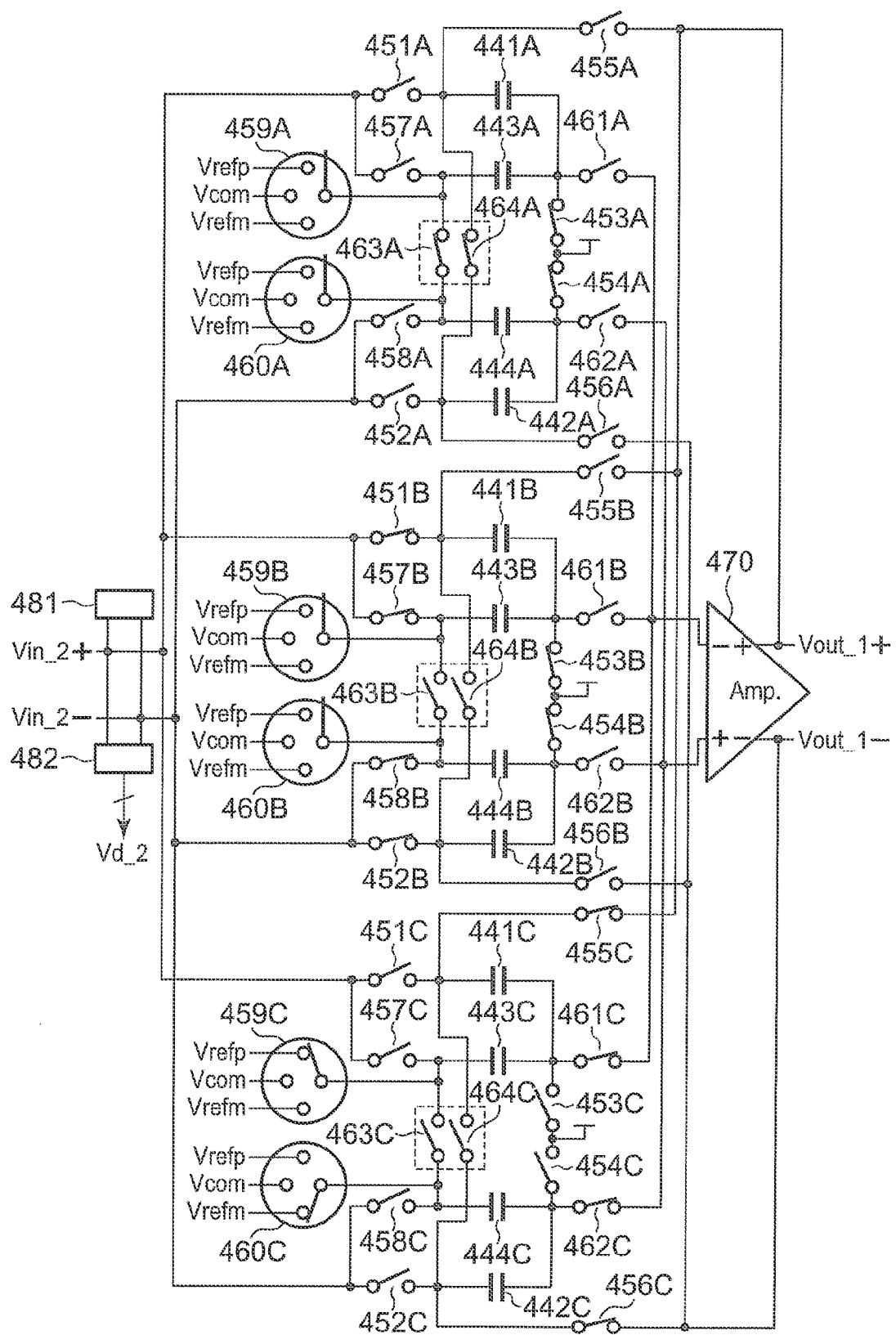
FIG. 27 is a block diagram showing the convert stage of the A/D converter in the sixth phase.

The convert stage 400-K realizes several behaviors (such as, a sample mode and a hold mode) by switching due to the switches 451A-464A, 451B-464B and 451C-464C. These behaviors are classified in six phases based on connection status of switches as shown in FIGS. 22-27, respectively. The first phase shown in FIG. 22 is the sample mode for the input signals Vin_1+, Vin_1– using the first capacitor set, and the hold mode for the input signals Vin_2+, Vin_2– using the second capacitor set. The second phase shown in FIG. 23 is the hold mode for the input signals Vin_1+, Vin_1– using the first capacitor set, and the sample mode for the input signals Vin_2+, Vin_2– using the third capacitor set. FIG. 24 is the sample mode for the input signals Vin_1+, Vin_1– using the second capacitor set, and the hold mode for the input signals Vin_2+, Vin_2– using the third capacitor set. The fourth phase shown in FIG. 25 is the hold mode for the input signals Vin_1+, Vin_1– using the second capacitor set, and the sample mode for the input signals Vin_2+, Vin_2– using the first capacitor set. The fifth phase shown in FIG. 26 is the sample mode for the input signals Vin_1+, Vin_1– using the third capacitor set, and the hold mode for the input signals Vin_2+, Vin_2– using the first capacitor set. The sixth phase shown in FIG. 27 is the hold mode for the input signals Vin_1+, Vin_1– using the third capacitor set, and the sample mode for the input signals Vin_2+, Vin_2– using the second capacitor set. The convert stage in the fourth embodiment performs the first to sixth phases periodically to sample and hold the input signals Vin_1+, Vin_1–, Vin_2+, Vin_2–.

The convert stage 400-K samples the input signals Vin_1+, Vin_1– in the first, third and fifth phases. Moreover, the convert stage 400-K converts input signals Vin_1+, Vin_1– from the previous convert stage 400-(K–1) to a digital output signal Vd_1 by comparing with the threshold voltages in the comparator 281. Simultaneously, the convert stage 400-K in the first, third and fifth phases holds the signals Vin_2+, Vin_2–, which were sampled in the second, fourth and sixth phases. Also, the convert stage 400-K outputs the output signals Vout_2+, Vout_2– to the next convert stage 400-(K+1) in the first, third and fifth phases.

On the other hand, the convert stage 400-K samples the input signals Vin_2+, Vin_2– in the second, fourth and sixth phases. Moreover, the convert stage 400-K converts input signals Vin_2+, Vin_2– from the previous convert stage 400-(K–1) to a digital output signal Vd_2 by comparing with the threshold voltages in the comparator 282. Simultaneously, the convert stage 400-K in the second, fourth and sixth phases holds the signals Vin_1+, Vin_1–, which were sampled in the first, third and fifth phases. Also, the convert stage 400-K outputs the output signals Vout_1+, Vout_1– to the next convert stage 400-(K+1) in the second, fourth and sixth phases.

The first input signals Vin_1+, Vin_1– and the second input signals Vin_2+, Vin_2– can share an operational amplifier 470 in the convert stage 400-K, because the first input signals Vin_1+, Vin_1– and the second input signals Vin_2+, Vin_2– are processed in different modes at a given time. The signals Vin_1+, Vin_1–, Vin_2+, Vin_2–, Vout_1+, Vout_1–, Vout_2+, and Vout_2– are all analog. Moreover, the minimum voltage of these signals is Vrefm, and the maximum voltage is Vrefp. The common-mode voltage of the input signals Vin+, Vin– is Vcom=(Vin_1++Vin_1–)/2=(Vin_2++Vin_2–)/2).

Adjacent convert stages are in different phases at a given time. For example, when the convert stage 400-K is in the first or third or fifth phase, the previous convert stage 400-(K–1) and the next convert stage 400-(K+1) are in the second or fourth or sixth phase. Then, when the convert stage 400-K is in the second or fourth or sixth phase, the previous convert stage 400-(K–1) and the next convert stage 400-(K+1) are in the first or third or fifth phase.

One terminal of the capacitor 441A is connected to a terminal of the capacitor 443A. Similarly, one terminal of the capacitors 442A is connected to a terminal of the capacitor 444A. The connection point of the capacitors 441A and 443A is connected to the connection point of the capacitors 442A and 444A through the switches 453A, 454A in the first, third, fourth, and sixth phases. Also, the connection point of the capacitors 441A and 443A is connected to an inverting input terminal of the operational amplifier 470 through the switch 461A in the second and fifth phases. The other terminal of the capacitor 441A is input the input signal Vin_1+ through the switch 451A in the first phase, and connected to a non-inverting output terminal of the operational amplifier 470 through the switch 455A in the second and fifth phases. Also, the other terminal of the capacitor 441A is connected to the other terminal of the capacitor 442A through the switch 464A in the third and sixth phases, and input the input signal Vin_2+ through the switch 451A in the fourth phase. The other terminal of the capacitor 443A is input the input signal Vin_1+ through the switch 457A in the first phase, and input a reference voltage through the switch 459A in the second and fifth phases. One of the voltages Vrefp, Vcom, Vrefm is selected as the reference voltage in the switch 459A according to either of digital output signals Vd_1, Vd_2, which is obtained in the previous first or fourth phase. Since the digital output signals Vd_1, Vd_2 could be three different values "00"/"01"/"11", the reference voltage has three choices Vrefp, Vcom, Vrefm. Also, the other terminal of the capacitor 443A is connected to the other terminal of the capacitor 444A through the switch 463A in the third and sixth phases, and input the input signal Vin_2+ through the switch 457A in the fourth phase.

The connection point of the capacitors 442A and 444A is connected to the connection point of the capacitors 441A and 443A through the switches 454A, 453A in the first, third, fourth, and sixth phases. Also, the connection point of the capacitors 442A and 444A is connected to a non-inverting input terminal of the operational amplifier 470 through the switch 462A in the second and fifth phases. The other terminal of the capacitor 442A is input the input signal Vin_1− through the switch 452A in the first phase, and connected to an inverting output terminal of the operational amplifier 470 through the switch 456A in the second and fifth phases. Also, the other terminal of the capacitor 442A is connected to the other terminal of the capacitor 441A through the switch 464A in the third and sixth phases, and input the input signal Vin_2− through the switch 452A in the fourth phase.

The other terminal of the capacitor 444A is input the input signal Vin_ through the switch 452A in the first phase, and input a reference voltage through the switch 460A in the second and fifth phases. One of the voltages Vrefp, Vcom, Vrefm is selected as the reference voltage in the switch 460A according to either of digital output signals Vd_1, Vd_2, which is obtained in the previous first or fourth phase. Also, the other terminal of the capacitor 444A is connected to the other terminal of the capacitor 443A through the switch 463A in the third and sixth phases, and input the input signal Vin_2− through the switch 452A in the fourth phase.

One terminal of the capacitor 441B is connected to a terminal of the capacitor 443B. Similarly, one terminal of the capacitors 442B is connected to a terminal of the capacitor 444B. The connection point of the capacitors 441B and 443B is connected to the connection point of the capacitors 442B and 444B through the switches 453B, 454B in the second, third, fifth and sixth phases. Also, the connection point of the capacitors 441B and 443B is connected to an inverting input terminal of the operational amplifier 470 through the switch 461B in the first and fourth phases. The other terminal of the capacitor 441B is connected to a non-inverting output terminal of the operational amplifier 470 through the switch 455B in the first and fourth phases, and connected to the other terminal of the capacitor 442B through the switch 464B in the second and fifth phases. Also, the other terminal of the capacitor 441B is input the input signal Vin_1+ through the switch 451B in the third phase, and input the input signal Vin_2+ through the switch 451B in the sixth phase. The other terminal of the capacitor 443B is input a reference voltage through the switch 459B in the first and fourth phases, and connected to the other terminal of the capacitor 444B through the switch 463B in the second and fifth phases. One of the voltages Vrefp, Vcom, Vrefm is selected as the reference voltage in the switch 459B according to either of digital output signals Vd_1, Vd_2, which is obtained in the previous sixth or third phase. Also, the other terminal of the capacitor 443B is input the input signal Vin_1+ through the switch 457B in the third phase, and input the input signal Vin_2+ through the switch 457B in the sixth phase.

The connection point of the capacitors 442B and 444B is connected to a non-inverting input terminal of the operational amplifier 470 through the switch 462B in the first and fourth phases. Also, the connection point of the capacitors 442B and 444B is connected to the connection point of the capacitors 441B and 443B through the switches 454B, 453B in the second, third, fifth and sixth phases. The other terminal of the capacitor 442B is connected to an inverting output terminal of the operational amplifier 470 through the switch 456B in the first and fourth phases, and connected to the other terminal of the capacitor 441B through the switch 464B in the second and fifth phases. Also, the other terminal of the capacitor 442B is input the input signal Vin_1− through the switch 452B in the third phase, and input the input signal Vin_2− through the switch 452B in the sixth phase.

The other terminal of the capacitor 444B is input a reference voltage through the switch 460B in the first and fourth phases, and connected to the other terminal of the capacitor 443B through the switch 463B in the second and fifth phases. One of the voltages Vrefp, Vcom, Vrefm is selected as the reference voltage in the switch 460B according to either of digital output signals Vd_1, Vd_2, which is obtained in the previous sixth or third phase. Also, the other terminal of the capacitor 444B is input the input signal Vin_1− through the switch 452B in the third phase, and input the input signal Vin_2− through the switch 452B in the sixth phase.

One terminal of the capacitor 441C is connected to a terminal of the capacitor 443C. Similarly, one terminal of the capacitors 442C is connected to a terminal of the capacitor 444C. The connection point of the capacitors 441C and 443C is connected to the connection point of the capacitors 442C and 444C through the switches 453C, 454C in the first, second, fourth, and fifth phases. Also, the connection point of the capacitors 441C and 443C is connected to an inverting input terminal of the operational amplifier 470 through the switch 461C in the third and sixth phases. The other terminal of the capacitor 441C is connected to the other terminal of the capacitor 442C through the switch 464C in the first and fourth phases, and input the input signal Vin_2+ through the switch 451C in the second phase. Also, the other terminal of the capacitor 441C is connected to a non-inverting output terminal of the operational amplifier 470 through the switch 455C in the third and sixth phases, and input the input signal Vin_1+ through the switch 451C in the fifth phase. The other terminal of the capacitor 443C is connected to the other terminal of the capacitor 444C through the switch 463C in the first and fourth phases, and input the input signal Vin_2+ through the switch 457C in the second phase. Also, the other terminal of the capacitor 443C is input a reference voltage through the switch 459C in the third and sixth phases, and input the input signal Vin_1+ through the switch 457C in the fifth phase. One of the voltages Vrefp, Vcom, Vrefm is selected as the reference voltage in the switch 459C according to either of digital output signals Vd_1, Vd_2, which is obtained in the previous second or fifth phase.

The connection point of the capacitors 442C and 444C is connected to the connection point of the capacitors 441C and 443C through the switches 454C, 453C in the first, second, fourth, and fifth phases. Also, the connection point of the capacitors 442C and 444C is connected to a non-inverting input terminal of the operational amplifier 470 through the switch 462C in the third and sixth phases. The other terminal of the capacitor 442C is connected to the other terminal of the capacitor 442C through the switch 464C in the first and fourth phases, and input the input signal Vin_2− through the switch 452C in the second phase. Also, the other terminal of the capacitor 442C is connected to an inverting output terminal of the operational amplifier 470 through the switch 456C in the third and sixth phases, and input the input signal Vin_1− through the switch 452C in the fifth phase.

The other terminal of the capacitor 444C is connected to the other terminal of the capacitor 443C through the switch 463C in the first and fourth phases, and input the input signal Vin_2− through the switch 452C in the second phase. Also, the other terminal of the capacitor 444C is input a reference voltage through the switch 460C in the third and sixth phases, and input the input signal Vin_1– through the switch 452C in the fifth phase. One of the voltages Vrefp, Vcom, Vrefm is selected as the reference voltage in the switch 460C according to either of digital output signals Vd_1, Vd_2, which is obtained in the previous second or fifth phase.

The operational amplifier 470 is a fully differential operational amplifier, including an inverting input terminal, a non-inverting input terminal, an inverting output terminal, and a non-inverting output terminal. The inverting input terminal and the non-inverting output terminal of the operational amplifier 470 are connected each other through the switch 461B, the capacitor 441B, and the switch 455B in the first and fourth phases. Also, they are connected each other through the switch 461A, the capacitor 441A, and the switch 455A in the second and fifth phases. Moreover, they are connected each other through the switch 461C, the capacitor 441C, and the switch 455C in the third and sixth phases.

The comparator 281 in the first, third and fifth phases compares the difference voltage between the input signals Vin_1+ and from the previous convert stage with the threshold voltages, and outputs a digital output signal Vd_1 according to the result of the comparison between the difference voltage between the input signals Vin_1+, and the threshold voltages. One of the voltages Vrefp, Vcom, Vrefm is selected as a reference voltage in each of switches 459A, 460A, 459B, 460B, 459C, 460C according to value of the digital output signal Vd_1 in the second, fourth and sixth phases. The reference voltages of the switches 459A, 460A are added to at the other terminals of the capacitors 443A, 444A, respectively, in the second phase. Also, the reference voltages of the switches 459B, 460B are added to at the other terminals of the capacitors 443B, 444B, respectively, in the fourth phase. Moreover, the reference voltages of the switches 459C, 460C are added to at the other terminals of the capacitors 443C, 444C, respectively, in the sixth phase.

The comparator 282 in the second, fourth and sixth phases compares the difference voltage between the input signals Vin_2+ and Vin_2– from the previous convert stage with the threshold voltages, and outputs a digital output signal Vd_2 according to the result of the comparison between the difference voltage between the input signals Vin_2+, Vin_2– and the threshold voltages. One of the voltages Vrefp, Vcom, Vrefm is selected as a reference voltage in each of switches 459A, 460A, 459B, 460B, 459C, 460C according to value of the digital output signal Vd_2 in the first, third and fifth phases. The reference voltages of the switches 459B, 460B are added to at the other terminals of the capacitors 443B, 444B, respectively, in the first phase. Also, the reference voltages of the switches 459C, 460C are added to at the other terminals of the capacitors 443C, 444C, respectively, in the third phase. Moreover, the reference voltages of the switches 459A, 460A are added to at the other terminals of the capacitors 443A, 444A, respectively, in the fifth phase.

Next, the behaviors of the convert stage 400-K will be explained according to each phase. Note that the behaviors of the convert stage 400-K in the fourth to sixth phases in FIGS. 25-27 are same as these in the first to third phases in FIGS. 22-24, except that the signals Vin_1+, Vin_1–, Vout_1+, and Vout_1– in the first to third phases are replaced with the signals Vin_2+, Vin_2–, Vout_2+, and Vout_2– in the fourth to sixth phases. Therefore, explanations for the fourth to sixth phases are skipped.

As shown in FIG. 22, the convert stage 400-K in the first phase is operating in the sample mode for the input signals Vin_1+, Vin_1–. The convert stage 400-K samples the input signals Vin_1+, Vin_1– from the previous convert stage 400-(K–1) in the first phase. The capacitors 441A, 443A sample the input signal Vin_1+, and the capacitors 442A, 444A sample the input signal Vin_1– by turning on the switches 451A-454A, 457A, 458A and turning off the switches 455A, 456A, 459A-464A. Moreover, the comparator 481 compares the difference voltage between the input signals Vin_1+ and Vin_1– with the threshold voltages to obtain the digital output signal Vd_1 (n bit) in the first phase.

At the same time, the convert stage 400-K in the first phase is operating in the hold mode for the input signals Vin_2+, Vin_2–, which were sampled by the capacitors 441B-444B in the previous sixth phase. The input signals Vin_2+, Vin_2– are held by turning off the switches 451B, 452B, 457B and 458B. Moreover, the reference voltages are input into the other terminals of capacitors 443B, 444B in the first phase. The reference voltages are according to the digital output signal Vd_2 generated in the previous sixth phase. Therefore, flows of the electric charge from the capacitors 441B-444B are caused, and the residual signals are output as output signals Vout_2+, Vout_2–. The residual signal is a signal which is generated by voltage difference between the input signals Vin_2+, Vin_2– and the reference voltages. These output signals Vout_2+, Vout_2– are used as the input signals Vin_2+, Vin_2– in the next convert stage 400-(K+1).

On the other hand, one terminal of each of capacitors 441C-444C is connected to other three by turning on the switches 453C, 454C and turning off the switches 461C, 462C. The other terminals of the capacitors 441C, 442C are connected each other by turning on the switch 464C and turning off the switches 451C, 452C, 455C-460C. The other terminals of the capacitors 443C, 444C are connected each other by turning on the switches 463C and turning off the switches 451C, 452C, 455C-460C. As a result, the voltages at both terminals of each of capacitors 441C, 442C, 443C, 444C become equal. Because the capacitances of the capacitors 441C, 442C, 443C, 444C are equal, electric charge in the capacitors 441C, 442C are discharged to be an average voltage at all terminals of capacitors 441C, 442C. Similarly, electric charges in the capacitors 443C, 444C are discharged to be an average voltage at all terminals of capacitors 443C, 444C. At last, since the voltages at all terminals of capacitors 441C-444C become equal, electric charge in the capacitors 441C-444C are all discharged to be an average voltage at all terminals of capacitors 441C-444C. The effect of these discharges will be described later.

As shown in FIG. 23, the convert stage 400-K in the second phase is operating in the sample mode for the input signals Vin_2+, Vin_2–. The convert stage 400-K samples the input signals Vin_2+, Vin_2– from the previous convert stage 400-(K–1) in the second phase. The capacitors 441C, 443C sample the input signal Vin_2+, and the capacitors 442C, 444C sample the input signal Vin_2– by turning on the switches 451C-454C, 457C, 458C and turning off the switches 455C, 456C, 459C-464C. Moreover, the comparator 482 compares the difference voltage between the input signals Vin_2+ and Vin_2– with the threshold voltages to obtain the digital output signal Vd_2 (n bit) in the second phase.

At the same time, the convert stage 400-K in the second phase is operating in the hold mode for the input signals Vin_1+, Vin_1–, which were sampled by the capacitors 441A-444A in the previous first phase. The input signals Vin_1+, Vin_1– are held by turning off the switches 451A, 452A, 457A and 458A. Moreover, the reference voltages are input into the other terminals of capacitors 443A, 444A in the second phase. The reference voltages are according to the digital output signal Vd_1 generated in the previous first phase. Therefore, flows of the electric charge from the capacitors 441A-444A are caused, and the residual signals are output as output signals Vout_1+, Vout_1−. The residual signal is a signal which is generated by voltage difference between the input signals Vin_1+, Vin_1− and the reference voltages. These output signals Vout_1+, Vout_1− are used as the input signals Vin_1+, Vin_1− in the next convert stage 400-(K+1).

On the other hand, one terminal of each of capacitors 441B-444B is connected to other three by turning on the switches 453B, 454B and turning off the switches 461B, 462B. The other terminals of the capacitors 441B, 442B are connected each other by turning on the switch 464B and turning off the switches 451B, 452B, 455B-460B. The other terminals of the capacitors 443B, 444B are connected each other by turning on the switches 463B and turning off the switches 451B, 452B, 455B-460B. As a result, the voltages at both terminals of each of capacitors 441B, 442B, 443B, 444B become equal. Because the capacitances of the capacitors 441B, 442B, 443B, 444B are equal, electric charge in the capacitors 441B, 442B are discharged to be an average voltage at all terminals of capacitors 441B, 442B. Similarly, electric charges in the capacitors 443B, 444B are discharged to be an average voltage at all terminals of capacitors 443B, 444B. At last, since the voltages at all terminals of capacitors 441B-444B become equal, electric charge in the capacitors 441B-444B are all discharged to be an average voltage at all terminals of capacitors 441B-444B.

As shown in FIG. 24, the convert stage 400-K in the third phase is operating in the sample mode for the input signals Vin_1+, Vin_1−. The convert stage 400-K samples the input signals Vin_1+, Vin_1− from the previous convert stage 400-(K−1) in the third phase. The capacitors 441B, 443B sample the input signal Vin_1+, and the capacitors 442B, 444B sample the input signal Vin_1− by turning on the switches 451B-454B, 457B, 458B and turning off the switches 455B, 456B, 459B-464B. Moreover, the comparator 481 compares the difference voltage between the input signals Vin_1+ and Vin_1− with the threshold voltages to obtain the digital output signal Vd_1 (n bit) in the third phase.

At the same time, the convert stage 400-K in the third phase is operating in the hold mode for the input signals Vin_2+, Vin_2−, which were sampled by the capacitors 441C-444C in the previous second phase. The input signals Vin_2+, Vin_2− are held by turning off the switches 451C, 452C, 457C and 458C. Moreover, the reference voltages are input into the other terminals of capacitors 443C, 444C in the third phase. The reference voltages are according to the digital output signal Vd_2 generated in the previous second phase. Therefore, flows of the electric charge from the capacitors 441C-444C are caused, and the residual signals are output as output signals Vout_2+, Vout_2−. The residual signal is a signal which is generated by voltage difference between the input signals Vin_2+, Vin_2− and the reference voltages. These output signals Vout_2+, Vout_2− are used as the input signals Vin_2+, Vin_2− in the next convert stage 400-(K+1).

On the other hand, one terminal of each of capacitors 441A-444A is connected to other three by turning on the switches 453A, 454A and turning off the switches 461A, 462A. The other terminals of the capacitors 441A, 442A are connected each other by turning on the switch 464A and turning off the switches 451A, 452A, 455A-460A. The other terminals of the capacitors 443A, 444A are connected each other by turning on the switches 463A and turning off the switches 451A, 452A, 455A-460A. As a result, the voltages at both terminals of each of capacitors 441A, 442A, 443A, 444A become equal. Because the capacitances of the capacitors 441A, 442A, 443A, 444A are equal, electric charge in the capacitors 441A, 442A are discharged to be an average voltage at all terminals of capacitors 441A, 442A. Similarly, electric charges in the capacitors 443A, 444A are discharged to be an average voltage at all terminals of capacitors 443A, 444A. At last, since the voltages at all terminals of capacitors 441A-444A become equal, electric charge in the capacitors 441A-444A are all discharged to be an average voltage at all terminals of capacitors 441A-444A.

The A/D converter in the fourth embodiment discharges the capacitors once before the sample mode. It is same as the A/D converter in the second embodiment. For example, before sampling the input signals Vin_1+, Vin_1− in the first phase, the capacitors 441A-444A have discharged electric charge which had been held during the fifth phase by connecting between both terminals of the capacitors 441A-444A in the sixth phase. Similarly, before sampling the input signals Vin_2+, Vin_2− in the second phase, the capacitors 441C-444C have discharged electric charge which had been held during the sixth phase by connecting between both terminals of the capacitors 441C-444C in the first phase. Moreover, before sampling the input signals Vin_1+, Vin_1− in the third phase, the capacitors 441B-444B have discharged electric charge which had been held during the first phase by connecting between both terminals of the capacitors 441B-444B in the second phase. Therefore, the A/D converter in the fourth embodiment can decreases the consumption power as same as the second embodiment. In addition to the effect, the A/D converter in the fourth embodiment realizes reduction of the circuit size. Because each convert stage in the A/D converter samples and holds two analog input signals with using three sets of capacitors. It can be eliminated one set of capacitors compared with the case of using two A/D converters which include four sets of capacitors in the second embodiment for two analog input signals.

Figure 28:
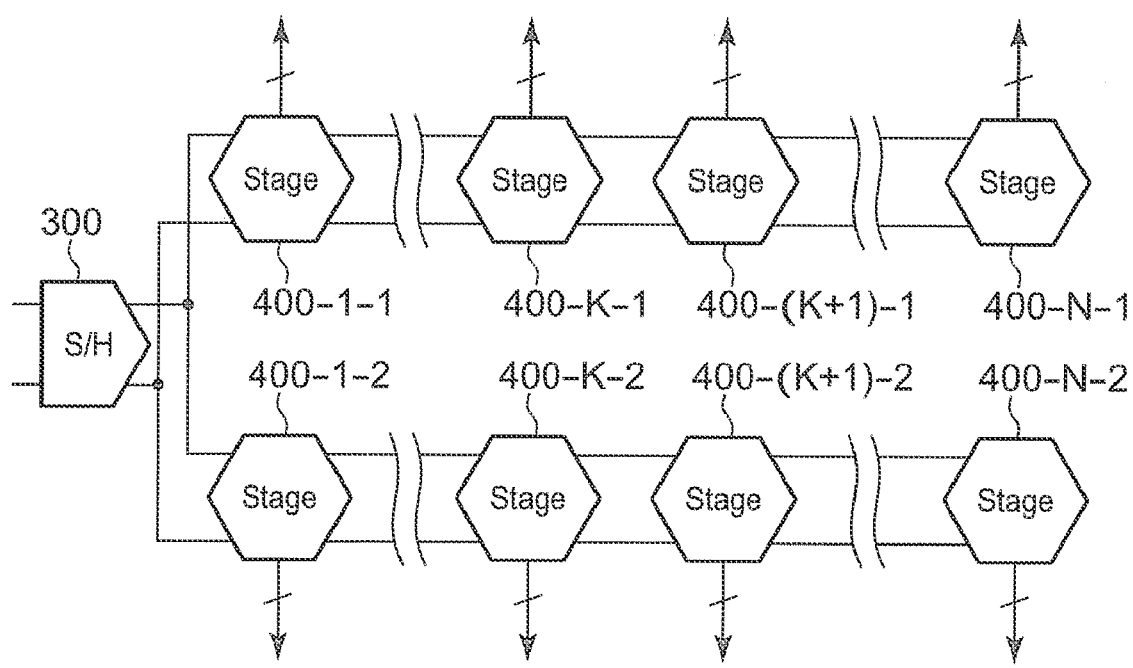
FIG. 28 is a block diagram showing another A/D converter according to the fourth embodiment.

The A/D converter in the fourth embodiment could be applied not only for two analog input signals but also for an analog input signal as shown in FIG. 28. In this case, a digital output signal with higher sample rate can be obtained compared with the A/D converter in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A sample-and-hold circuit comprising:
an operational amplifier including an inverting input terminal, a non-inverting input terminal, an inverting output terminal, and a non-inverting output terminal; and
a first and second groups of capacitors, each being operated in first to third modes periodically, wherein
positive and negative input signals being input to charge an electric charge in the first mode,
the electric charge being held while positive and negative output signals being output from the operational amplifier by connecting between the inverting input terminal and the non-inverting output terminal and by connecting between the non-inverting input terminal and the inverting output terminal in the second mode, and
the electric charge being discharged in the third mode; wherein
the second group of capacitors shifts to the third mode when the first group of capacitors is in the first or second mode, and shift to the first or second mode when the first group of capacitors is in the third mode.

2. An A/D converter comprising the sample-and-hold circuit of claim 1.

3. The A/D converter of claim 2, comprising cascaded convert stages, each convert stage including:
- a comparator generating a digital signal by comparing positive and negative analog input signals and a threshold voltage; and
- the sample-and-hold circuit of claim 1.

4. A sample-and-hold circuit comprising:
- an operational amplifier including an inverting input terminal, a non-inverting input terminal, an inverting output terminal, and a non-inverting output terminal; and
- a first, second and third groups of capacitors, each being operated in first to third modes periodically, wherein
- positive and negative input signals being input to charge an electric charge in the first mode,
- the electric charge being held while positive and negative output signals being output from the operational amplifier by connecting between the inverting input terminal and the non-inverting output terminal and by connecting between the non-inverting input terminal and the inverting output terminal in the second mode, and
- the electric charge being discharged in the third mode; wherein
- the second group of capacitors shifts to the second mode when the first group of capacitors is in the first mode, shifts to the third mode when the first group of capacitors is in the second mode, and shift to the first mode when the first group of capacitors is in the third mode; and
- the third group of capacitors shifts to the third mode when the first group of capacitors is in the first mode, shifts to the first mode when the first group of capacitors is in the second mode, and shift to the second mode when the first group of capacitors is in the third mode.

5. An A/D converter comprising the sample-and-hold circuit of claim 4.

6. The A/D converter of claim 5, comprising cascaded convert stages, each convert stage including:
- a comparator generating a digital signal by comparing positive and negative analog input signals and a threshold voltage; and
- the sample-and-hold circuit of claim 4.

* * * * *